United States Patent
Kunisato et al.

(10) Patent No.: US 7,154,123 B2
(45) Date of Patent: Dec. 26, 2006

(54) NITRIDE-BASED SEMICONDUCTOR LIGHT-EMITTING DEVICE

(75) Inventors: Tatsuya Kunisato, Takatsuki (JP); Ryoji Hiroyama, Kyo-tanabe (JP); Masayuki Hata, Kadoma (JP); Kiyoshi Oota, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/060,484

(22) Filed: Feb. 18, 2005

(65) Prior Publication Data

US 2005/0199891 A1    Sep. 15, 2005

(30) Foreign Application Priority Data

Mar. 10, 2004  (JP)  ............... 2004-066624

(51) Int. Cl.
*H01L 29/167*    (2006.01)
(52) U.S. Cl. ............... 257/86; 257/200; 257/E29.089
(58) Field of Classification Search .............. 257/14, 257/21, 22, 46, 79–103, E21.126, E21.127, 257/E21.138, E21.142, E21.155, E21.157, 257/183, 200, E33.001, E33.002, E33.023, 257/E33.049, E31.059, E29.089
See application file for complete search history.

(56) References Cited

U.S. PATENT DOCUMENTS

| | | | | | |
|---|---|---|---|---|---|
| 5,740,192 | A | * | 4/1998 | Hatano et al. | 372/45.01 |
| 2001/0030328 | A1 | * | 10/2001 | Ishida | 257/103 |
| 2003/0197169 | A1 | * | 10/2003 | Lee et al. | 257/14 |

FOREIGN PATENT DOCUMENTS

JP        9-8403        1/1997

* cited by examiner

*Primary Examiner*—Brook Kebede
(74) *Attorney, Agent, or Firm*—McDermott Will & Emery LLP

(57) ABSTRACT

A nitride-based semiconductor light-emitting device capable of improving light extraction efficiency is provided. This nitride-based semiconductor light-emitting device comprises a first nitride-based semiconductor layer formed on the surface of a conductive substrate, an active layer formed on the first nitride-based semiconductor layer, a second nitride-based semiconductor layer formed on the active layer and a light transmission layer, formed on the second nitride-based semiconductor layer, having a carrier concentration lower than the carrier concentration of the second nitride-based semiconductor layer.

20 Claims, 24 Drawing Sheets

LASER IRRADIATION

NITRIDE-BASED SEMICONDUCTOR LIGHT-EMITTING DEVICE

BACKGROUND OF THE INVENTION

1. Field of the Invention

The present invention relates to a nitride-based semiconductor light-emitting device, and more particularly, it relates to a nitride-based semiconductor light-emitting device comprising nitride-based semiconductor layers.

2. Description of the Background Art

A nitride-based semiconductor light-emitting device such as a nitride-based semiconductor light-emitting diode device is actively developed at present. In order to employ a nitride-based semiconductor light-emitting diode device as the light source for a lighting apparatus, improvement of the light output characteristic of the nitride-based semiconductor light-emitting diode device and increase of an applied current have recently been developed in particular. In order to form such a nitride-based semiconductor light-emitting diode device, nitride-based semiconductor layers are grown on a sapphire substrate requiring a lower cost than a high-priced nitride-based semiconductor substrate of GaN or the like.

FIG. 48 is a sectional view showing the structure of a conventional nitride-based semiconductor light-emitting diode device. Referring to FIG. 48, a buffer layer 152, an underlayer 153, an n-type contact layer 154, an n-type cladding layer 155 and an active layer 156 are successively formed on an insulating sapphire substrate 151 in the conventional nitride-based semiconductor light-emitting diode device. A cap layer 157, a p-type cladding layer 158 and a p-type contact layer 159 are successively formed on the active layer 156. The n-type contact layer 154, the n-type cladding layer 155, the active layer 156, the cap layer 157, the p-type cladding layer 158 and the p-type contact layer 159 constitute a nitride-based semiconductor element layer 150.

A prescribed region of the nitride-based semiconductor element layer 150 is removed between the upper surface of the p-type contact layer 159 and a portion of an intermediate depth of the n-type contact layer 154, for partially exposing the n-type contact layer 154. A p-side electrode 160 is formed on the p-type contact layer 159, while an n-side electrode 161 is formed on a prescribed region of the exposed surface of the n-type contact layer 154.

In the conventional nitride-based semiconductor light-emitting diode device shown in FIG. 48, as hereinabove described, the p-side electrode 160 and the n-side electrode 161 are taken out from the surface of the nitride-based semiconductor element layer 150 opposite to the sapphire substrate 151. In order to increase the emission area for improving the light output characteristic, therefore, light must be emitted from the side of the sapphire substrate 151 formed with neither the p-side electrode 160 nor the n-side electrode 161. Therefore, flip chip bonding is employed for mounting the conventional nitride-based semiconductor light-emitting diode device shown in FIG. 48 on a base (not shown) from the side of the p-side electrode 160 and the n-side electrode 161.

However, the conventional nitride-based semiconductor light-emitting diode device shown in FIG. 48 has a step between the p-side electrode 160 formed on the p-type contact layer 159 and the n-side electrode 161 formed on the exposed surface of the n-type contact layer 154. In order to assemble the conventional nitride-based semiconductor light-emitting diode device shown in FIG. 48 by flip chip bonding, therefore, the base must be provided with a step portion corresponding to the step between the p-side electrode 160 and the n-side electrode 161, and precise position control is required for aligning the positions of the step portion and the p- and n-side electrodes 160 and 161 with each other. Therefore, the manufacturing yield is disadvantageously reduced.

In relation to this, a nitride-based semiconductor light-emitting diode device formed by growing a nitride-based semiconductor element layer on a sapphire substrate and thereafter bonding a cleavable conductive substrate of GaAs or the like to the nitride-based semiconductor element layer and removing the sapphire substrate is proposed in general, as disclosed in Japanese Patent Laying-Open No. 9-8403 (1997), for example. In the aforementioned nitride-based semiconductor light-emitting diode device disclosed in Japanese Patent Laying-Open No. 9-8403, a p-side electrode and an n-side electrode can be oppositely arranged through the nitride-based semiconductor element layer, due to the employment of the conductive substrate. Therefore, the nitride-based semiconductor light-emitting diode device may not be assembled by flip chip bonding requiring precise position control dissimilarly to the case of employing the insulating sapphire substrate, whereby the manufacturing yield can be improved.

In the aforementioned nitride-based semiconductor light-emitting diode device disclosed in Japanese Patent Laying-Open No. 9-8403, the nitride-based semiconductor element layer bonded to the conductive substrate is formed by a p-type nitride-based semiconductor layer, an active layer and an n-type nitride-based semiconductor layer successively from the side closer to the conductive substrate, for emitting light from the surface of the n-type nitride-based semiconductor layer. However, impurity levels are formed in the n-type nitride-based semiconductor layer doped with an n-type impurity, to result in light absorption. Consequently, the n-type nitride-based semiconductor layer easily absorbs light totally reflected on the surface thereof, to disadvantageously reduce light extraction efficiency.

SUMMARY OF THE INVENTION

The present invention has been proposed in order to solve the aforementioned problems, and an object of the present invention is to provide a nitride-based semiconductor light-emitting device capable of improving light extraction efficiency.

In order to attain the aforementioned object, a nitride-based semiconductor light-emitting device according to an aspect of the present invention comprises a first conductive type first nitride-based semiconductor layer formed on the surface of a conductive substrate, an active layer of a nitride-based semiconductor formed on the first nitride-based semiconductor layer, a second conductive type second nitride-based semiconductor layer formed on the active layer and a light transmission layer, formed on the second nitride-based semiconductor layer, consisting of a nitride-based semiconductor layer having a carrier concentration lower than the carrier concentration of the second nitride-based semiconductor layer.

In the nitride-based semiconductor light-emitting device according to this aspect, as hereinabove described, the carrier concentration of the light transmission layer consisting of the nitride-based semiconductor layer is lower than that of the second nitride-based semiconductor layer, whereby the light transmission layer can be more hardly formed with impurity levels as compared with the second nitride-based semiconductor layer. Thus, the light transmission layer can be more inhibited from light absorption resulting from impurity levels as compared with the second nitride-based semiconductor layer. Therefore, light totally reflected on a light emission surface (surface of the light transmission layer) passes through the light transmission layer exhibiting smaller light absorption than the second nitride-based semiconductor layer. Thus, the probability of light absorption can be more reduced as compared with a case where the light totally reflected on the light emission surface passes through only the second nitride-based semiconductor layer easily causing light absorption resulting from impurity levels. Consequently, the light totally reflected on the light emission surface can be inhibited from absorption, whereby light extraction efficiency can be improved.

In the nitride-based semiconductor light-emitting device according to the aforementioned aspect, the first conductive type first nitride-based semiconductor layer is preferably a p-type nitride-based semiconductor layer, and the second conductive type second nitride-based semiconductor layer is preferably an n-type nitride-based semiconductor layer. According to this structure, the light extraction efficiency can be improved in the nitride-based semiconductor light-emitting device emitting light from the side of the n-type nitride-based semiconductor layer.

In the nitride-based semiconductor light-emitting device according to the aforementioned aspect, the light transmission layer may include an undoped nitride-based semiconductor layer. According to this structure, no impurity levels resulting from impurity doping are formed on the light transmission layer, whereby the light transmission layer can be further inhibited from light absorption resulting from impurity levels. The term "undoped" employed in relation to the present invention indicates a state not intentionally doped with an impurity. Therefore, the term "undoped" includes not only a state doped with absolutely no impurities but also a state mixed with a small quantity of unintentionally introduced impurity.

In the nitride-based semiconductor light-emitting device according to the aforementioned aspect, the light transmission layer may include a second conductive type nitride-based semiconductor layer doped with a second conductive type impurity. According to this structure, the light transmission layer exhibits a lower carrier concentration than the second nitride-based semiconductor layer, whereby the second conductive type light transmission layer doped with the second conductive type impurity can be more inhibited from light absorption resulting from impurity levels as compared with the second nitride-based semiconductor layer.

In the nitride-based semiconductor light-emitting device according to the aforementioned aspect, the light transmission layer preferably includes a nitride-based semiconductor layer containing at least Al. This nitride-based semiconductor layer, having a band gap larger than that of a nitride-based semiconductor layer consisting of GaN or InGaN, exhibits a smaller absorption end than the nitride-based semiconductor layer consisting of GaN or InGaN. In the nitride-based semiconductor layer containing Al, therefore, a wavelength allowing no passage of light is more reduced as compared with the nitride-based semiconductor layer consisting of GaN or InGaN. Therefore, the range of optical wavelengths causing no light absorption can be widened in the light transmission layer formed to include the nitride-based semiconductor layer containing at least Al. Thus, the range for setting the emission wavelength of the nitride-based semiconductor light-emitting device can be easily widened.

In this case, the light transmission layer preferably includes the nitride-based semiconductor layer of AlGaN. According to this structure, the range of optical wavelengths causing no light absorption can be easily widened in the light transmission layer.

In the nitride-based semiconductor light-emitting device according to the aforementioned aspect, the light transmission layer preferably has a textured surface. According to this structure, a light emission surface (surface of the light transmission layer) can be inhibited from totally reflecting light, whereby the light extraction efficiency can be further improved.

The nitride-based semiconductor light-emitting device according to the aforementioned aspect preferably further comprises a layer, formed on the light transmission layer, having a textured surface and consisting of a material other than a nitride-based semiconductor. According to this structure, the light emission surface (surface of the layer consisting of the material other than a nitride-based semiconductor) can be inhibited from totally reflecting light, whereby the light extraction efficiency can be further improved.

In this case, the layer consisting of the material other than a nitride-based semiconductor preferably includes an insulating film. According to this structure, the surface of the insulating film (light emission surface) can be inhibited from totally reflecting light, whereby the light extraction efficiency can be easily further improved.

In the nitride-based semiconductor light-emitting device according to the aforementioned aspect, the light transmission layer preferably consists of a material substantially identical to the material for the second nitride-based semiconductor layer. According to this structure, the refractive indices of the light transmission layer and the second nitride-based semiconductor layer can be substantially equalized with each other, whereby the interface between the light transmission layer and the second nitride-based semiconductor layer can be inhibited from light reflection resulting from different refractive indices. Thus, the light extraction efficiency can be further improved.

In the aforementioned structure having the light transmission layer and the second nitride-based semiconductor layer consisting of substantially identical materials, the light transmission layer and the second nitride-based semiconductor layer may be formed by GaN layers. According to this structure, the interface between the light transmission layer (GaN layer) and the second nitride-based semiconductor layer (GaN layer) can be easily inhibited from light reflection resulting from different refractive indices.

In the aforementioned structure having the light transmission layer and the second nitride-based semiconductor layer consisting of substantially identical materials, the light transmission layer and the second nitride-based semiconductor layer may be formed by AlGaN layers. According to this structure, the interface between the light transmission layer (AlGaN layer) and the second nitride-based semiconductor layer (AlGaN layer) can be easily inhibited from light reflection resulting from different refractive indices.

In the nitride-based semiconductor light-emitting device according to the aforementioned aspect, the first nitride-based semiconductor layer is preferably formed on the surface of the conductive substrate through a first electrode layer, and the first electrode layer preferably also functions as a reflecting film. According to this structure, the first electrode layer (reflecting film) can reflect light advancing toward the conductive substrate toward the light emission surface, whereby the light extraction efficiency can be further improved.

In this case, the surface of the first electrode layer closer to the first nitride-based semiconductor layer is preferably textured. According to this structure, light incident upon the interface between the first electrode layer (reflecting film) and the first nitride-based semiconductor layer can be so easily reflected that the quantity of light emitted from the light emission surface opposite to the first electrode layer can be increased.

In the nitride-based semiconductor light-emitting device according to the aforementioned aspect, the light transmission layer is preferably formed on a partial region of the second nitride-based semiconductor layer, and the nitride-based semiconductor light-emitting device preferably further comprises a second electrode layer formed to be in contact with a region of the surface of the second nitride-based semiconductor layer not formed with the light transmission layer. According to this structure, the second electrode layer comes into contact with the surface of the second nitride-based semiconductor layer having a high carrier concentration, whereby contact resistance of the second electrode layer is not increased also when the light transmission layer having a low carrier concentration or in an undoped state is formed on the second nitride-based semiconductor layer.

In the aforementioned structure further comprising the second electrode layer, the light transmission layer preferably has an opening, and the second electrode layer is preferably formed in the opening to be in contact with the surface of the second nitride-based semiconductor layer. According to this structure, the second electrode layer can be easily brought into contact with the surface of the second nitride-based semiconductor layer.

In the aforementioned structure further comprising the second electrode layer, the nitride-based semiconductor light-emitting device preferably further comprises a layer, formed on the light transmission layer, consisting of a material other than a nitride-based semiconductor, the layer consisting of the material other than a nitride-based semiconductor and the light transmission layer preferably have openings, and the second electrode layer is preferably formed in the openings to be in contact with the surface of the second nitride-based semiconductor layer. According to this structure, the second electrode layer can be easily brought into contact with the surface of the second nitride-based semiconductor layer when the layer consisting of the material other than a nitride-based semiconductor is formed on the light transmission layer.

The nitride-based semiconductor light-emitting device according to the aforementioned aspect preferably further comprises a protective film covering the side surfaces of the first nitride-based semiconductor layer, the active layer, the second nitride-based semiconductor layer and the light transmission layer. According to this structure, the first nitride-based semiconductor layer, the active layer, the second nitride-based semiconductor layer and the light transmission layer can be easily protected with the protective film.

In the nitride-based semiconductor light-emitting device according to the aforementioned aspect, the light transmission layer preferably has a side surface inclined by a prescribed angle with respect to the normal of a light emission surface. According to this structure, the path of light can be so changed that the angle of incidence of the light with respect to the light emission surface is smaller than the critical angle also when the light is totally reflected on the light emission surface, since the totally reflected light is incident upon the side surface of the light transmission layer inclined with respect to the normal of the light emission surface. Consequently, the nitride-based semiconductor light-emitting device can also emit the light totally reflected on the light emission surface, whereby the light extraction efficiency can be improved.

In the nitride-based semiconductor light-emitting device according to the aforementioned aspect, light formed in the active layer is preferably emitted through the light transmission layer. According to this structure, the probability of light absorption can be more reduced as compared with a case where light passes through only the second nitride-based semiconductor layer easily causing light absorption resulting from impurity levels, whereby the light totally reflected on the light emission surface can be easily inhibited from absorption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure a nitride-based semiconductor light-emitting diode device according to a first embodiment of the present invention is described with reference to FIG. 1.

Figure 1:
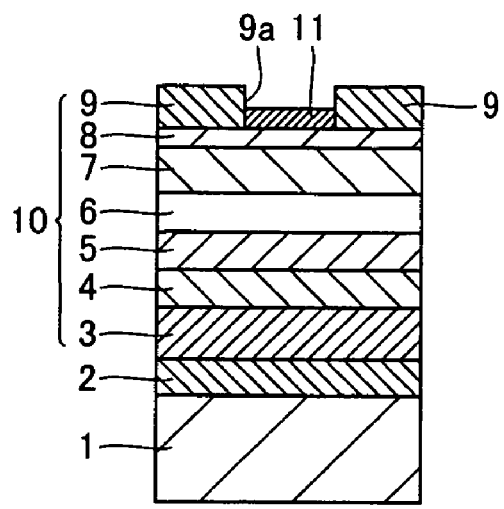
FIG. 1 is a sectional view showing the structure of a nitride-based semiconductor light-emitting diode device (nitride-based semiconductor light-emitting device) according to a first embodiment of the present invention.

In the nitride-based semiconductor light-emitting diode device according to the first embodiment, a p-side electrode 2 prepared by successively forming an Au layer having a thickness of about 100 nm and a Pd layer having a thickness of about 300 nm from a side closer to a conductive substrate 1 is bonded to the conductive substrate 1 having a thickness of about 50 µm to about 2 mm, as shown in FIG. 1. The p-side electrode 2 is an example of the "first electrode layer" in the present invention. This p-side electrode 2 functions also as a reflecting film. A p-type contact layer 3 of GaN, AlGaN or InGaN doped with Mg having a thickness of about 1 nm to about 1 µm is formed on the p-side electrode 2. A p-type cladding layer 4 of AlGaN doped with Mg having a thickness of about 1 nm to about 1 µm is formed on the p-type contact layer 3. A cap layer 5 of Mg-doped or undoped GaN or AlGaN having a thickness of about 10 nm to about 40 nm is formed on the p-type cladding layer 4. The p-type contact layer 3, the p-type cladding layer 4 and the cap layer 5 are examples of the "first nitride-based semiconductor layer" in the present invention.

The conductive substrate 1 consists of a semiconductor, a metal, a conductive resin film or a composite material of a metal and a metal oxide. The semiconductor used for the conductive substrate 1 is prepared from Si, SiC, GaAs or ZnO having cleavability. The metal used for the conductive substrate 1 is prepared from Al, Fe—Ni or Cu—W. The conductive resin film used for the conductive substrate 1 is formed by a resin film in which conductive grains of a metal or the like are dispersed. The composite material of a metal and a metal oxide used for the conductive substrate 1 is prepared from Cu—CuO or the like.

An active layer 6 including a well layer of InGaN having a thickness of about 3 nm and a barrier layer of InGaN or GaN having a thickness of about 10 nm is formed on the cap layer 5. This active layer 6 has a multiple quantum well (MQW) structure including a plurality of well layers and a plurality of barrier layers or a single quantum well (SQW) structure including a single well layer and a single barrier layer.

An n-type cladding layer 7 of AlGaN (Al composition ratio $\leq$50%) doped with Si or Ge having a thickness of about 1 nm to about 1 µm is formed on the active layer 6. An n-type contact layer 8 of GaN or AlGaN doped with Si or Ge having a thickness of about 10 nm to about 5 µm is formed on the n-type cladding layer 7. The n-type cladding layer 7 and the n-type contact layer 8 have carrier concentrations of about $5 \times 10^{18}$ cm$^{-3}$. The n-type cladding layer 7 and the n-type contact layer 8 are examples of the "second nitride-based semiconductor layer" in the present invention.

According to the first embodiment, a light transmission layer 9 of GaN doped with Si having a thickness of about 1 nm to about 2 µm is formed on the n-type contact layer 8. This light transmission layer 9 has a carrier concentration lower than those (about $5 \times 10^{18}$ cm$^{-3}$) of the n-type cladding layer 7 and the n-type contact layer 8. Further, the light transmission layer 9 has an opening 9a. The p-type contact layer 3, the p-type cladding layer 4, the cap layer 5, the active layer 6, the n-type cladding layer 7, the n-type contact layer 8 and the light transmission layer 9 constitute a nitride-based semiconductor element layer 10. An n-side electrode 11 is formed in the opening 9a of the light transmission layer 9, to be in contact with the surface of the n-type contact layer 8. The n-side electrode 11 is constituted of an Al layer having a thickness of about 10 nm, a Pd layer having a thickness of about 10 nm and an Au layer having a thickness of about 100 nm in ascending order. The n-side electrode 11 is an example of the "second electrode layer" in the present invention.

In the nitride-based semiconductor light-emitting diode device according to the first embodiment shown in FIG. 1, the surface of the light transmission layer 9 serves as a light emission surface.

According to the first embodiment, as hereinabove described, the carrier concentration of the light transmission layer 9 of GaN doped with Si is so set lower than those (about $5 \times 10^{18}$ cm$^{-3}$) of the n-type cladding layer 7 and the n-type contact layer 8 that the light transmission layer 9 can be more inhibited from formation of impurity levels as compared with the n-type contact layer 8. Thus, the light transmission layer 9 can be more inhibited from light absorption resulting from impurity levels as compared with the n-type cladding layer 7 and the n-type contact layer 8. Therefore, light totally reflected on the light emission surface (surface of the light transmission layer 9) passes through the light transmission layer 9 exhibiting smaller light absorption as compared with the n-type cladding layer 7 and the n-type contact layer 8. Thus, the probability of light absorption can be more reduced as compared with a case where the light totally reflected on the light emission surface passes through only the n-type cladding layer 7 and the n-type contact layer 8 easily absorbing the light totally reflected on the light emission surface due to impurity levels. Consequently, the light totally reflected on the light emission surface can be inhibited from absorption, whereby light extraction efficiency can be improved.

When the n-type contact layer 8 of GaN or AlGaN is prepared from GaN identically to the light transmission layer 9, the refractive indices of the light transmission layer 9 and the n-type contact layer 8 can be substantially equalized to each other in the first embodiment. In this case, the interface between the light transmission layer 9 and the n-type contact layer 8 can be inhibited from light reflection resulting from different refractive indices, whereby the light extraction efficiency can be further improved.

According to the first embodiment, the light transmission layer 9 is provided with the opening 9a so that the n-side electrode 11 is formed in the opening 9a of the light transmission layer 9 to be in contact with the surface of the n-type contact layer 8, whereby the n-side electrode 11 comes into contact with the n-type contact layer 8 having a high carrier concentration and hence contact resistance of the n-side electrode 11 is not increased due to formation of the light transmission layer 9 having a low carrier concentration on the n-type contact layer 8.

According to the first embodiment, in addition, the conductive substrate 1 and the nitride-based semiconductor element layer 10 are so bonded to each other through the p-side electrode 2 serving as a reflecting film that the p-side electrode (reflecting film) 2 can reflect light advancing toward the conductive substrate 1 toward the light emission surface, whereby the light transmission efficiency can be further improved.

A manufacturing process for the nitride-based semiconductor light-emitting diode device according to the first embodiment is now described with reference to FIGS. 1 to 7.

Figure 2:
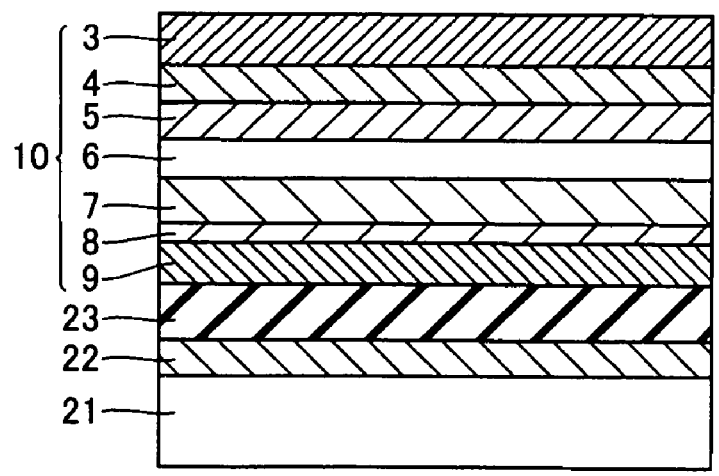
FIGS. 2 to 7 are sectional views for illustrating a manufacturing process for the nitride-based semiconductor light-emitting diode device according to the first embodiment shown in FIG. 1.

As shown in FIG. 2, a buffer layer 22 of GaN or AlGaN having a thickness of about 10 nm to about 100 nm is grown on the (0001) plane of a sapphire substrate 21, employed as a growth substrate, having a thickness of about 400 μm by MOCVD (metal organic chemical vapor deposition). Then, an underlayer 23 of undoped GaN or AlGaN having a thickness of about 1 μm is grown on the buffer layer 23. Then, the light transmission layer 9 of GaN doped with Si having the thickness of about 1 nm to about 2 μm is grown on the underlayer 23, and the n-type contact layer 8, the n-type cladding layer 7, the active layer 6, the cap layer 5, the p-type cladding layer 4 and the p-type contact layer 3 having the aforementioned compositions and thicknesses respectively are thereafter successively grown on the light transmission layer 9. Thereafter the p-type cladding layer 4 and the p-type contact layer 3 are converted to the p type by heat treatment or electron beam irradiation.

Figure 3:
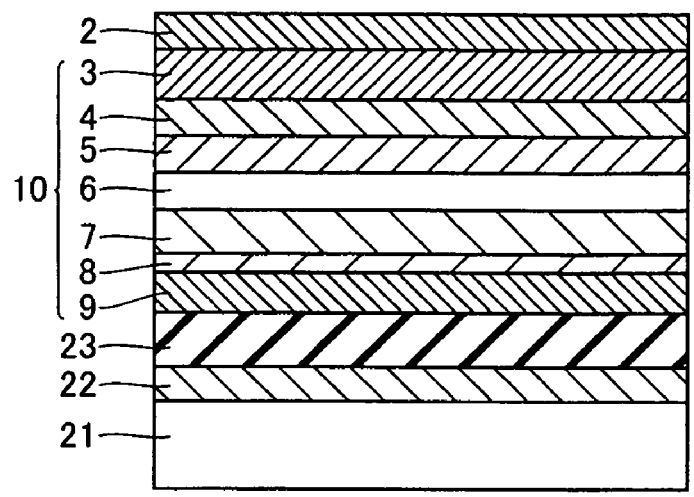

As shown in FIG. 3, the p-side electrode 2 is formed on the p-type contact layer 3 by vacuum evaporation or the like. The p-side electrode 2 is prepared by forming the Au layer having the thickness of about 100 nm and the Pd layer having the thickness of about 300 nm in this order.

Figure 4:
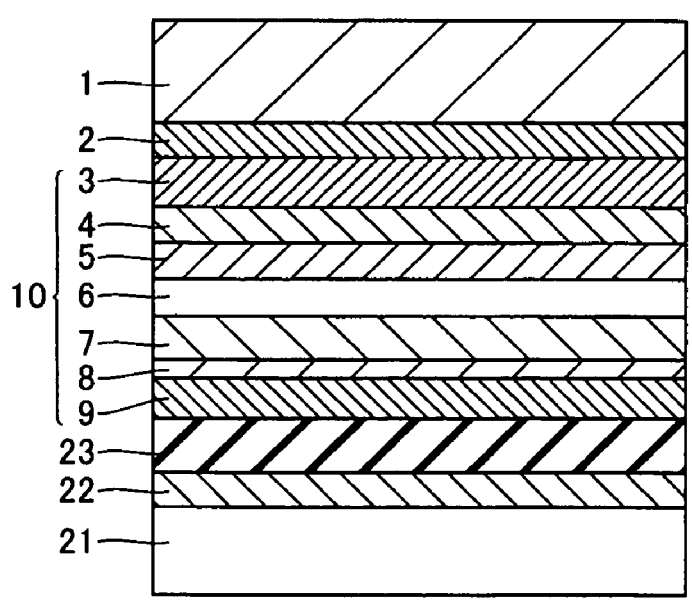
Figure 5:
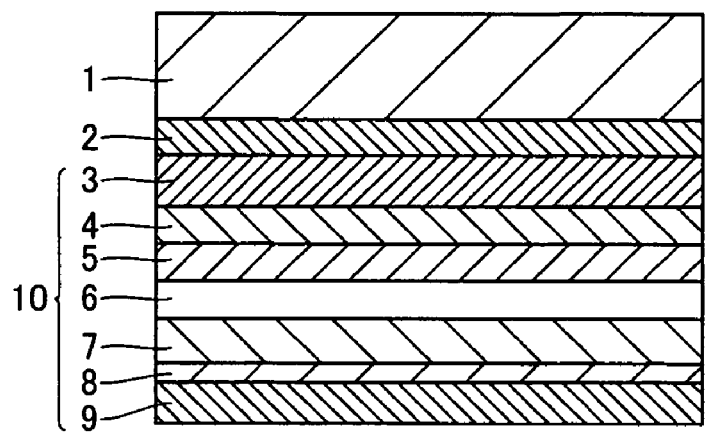

As shown in FIG. 4, the conductive substrate 1 having the thickness of about 50 μm to about 2 mm is bonded onto the upper surface of the p-side electrode 2. At this time, the conductive substrate 1 may be bonded onto the upper surface of the p-side electrode 2 through solder of Au—Sn or Pd—Sn or through conductive paste of Ag. Alternatively, the conductive substrate 1 may be directly pasted onto the upper surface of the p-side electrode 2 and thereafter pressurized under a temperature condition of about 400° C. to about 1000° C., to be bonded to the upper surface of the p-side electrode 2. Further alternatively, the conductive substrate 1 may be bonded onto the upper surface of the p-side electrode 2 by anodic bonding of applying an electric field to the conductive substrate 1. Thereafter the sapphire substrate 21 is removed by polishing or laser irradiation. The buffer layer 22 and the underlayer 23 are removed by dry etching with $CF_4$ gas or wet etching with a hot phosphoric acid solution. Thus, the surface of the light transmission layer 9 is exposed as shown in FIG. 5.

Figure 6:
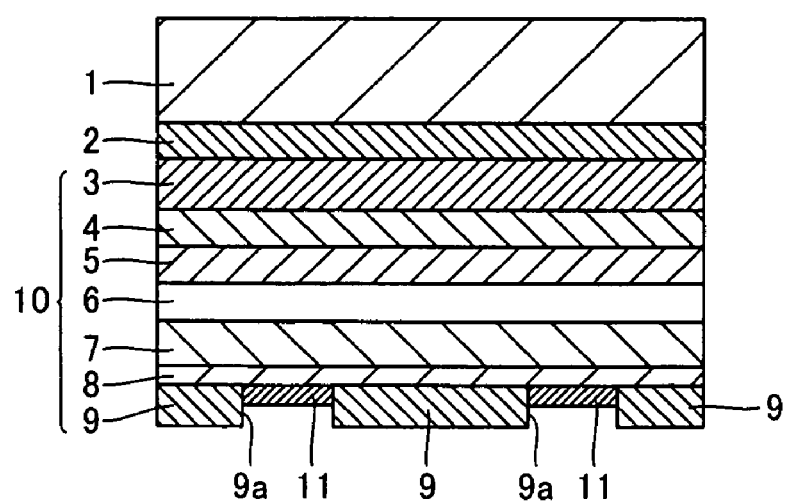

As shown in FIG. 6, the opening 9a is formed on a prescribed region of the light transmission layer 9 by etching, to expose the surface of the n-type contact layer 8. Thereafter the n-side electrode 11 is formed in the opening 9a of the light transmission layer 9 by vacuum evaporation or the like, to be in contact with the exposed surface of the n-type contact layer 8. This n-side electrode 11 is prepared by forming the Al layer having the thickness of about 10 nm, the Pd layer having the thickness of about 10 nm and the Au layer having the thickness of about 100 nm in this order.

Figure 7:
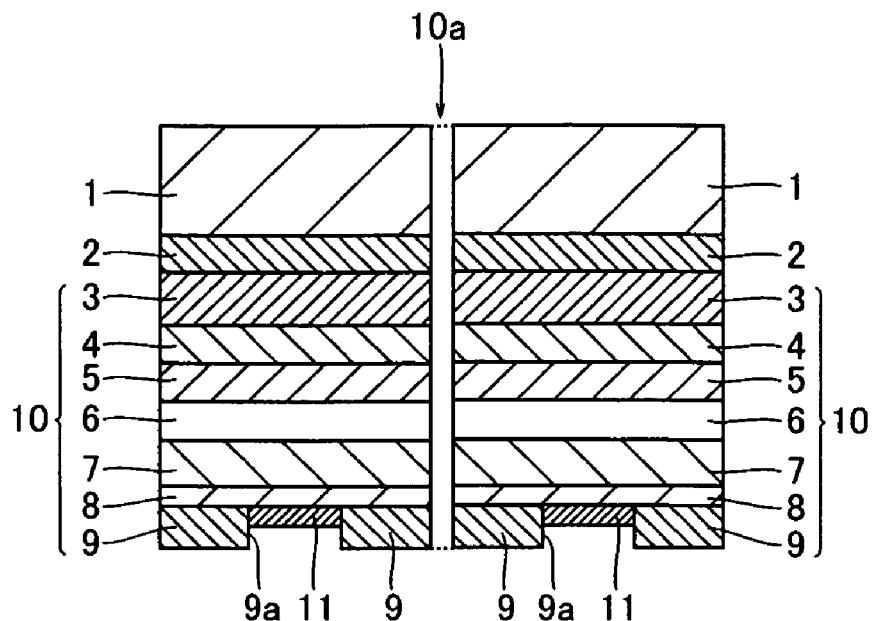

As shown in FIG. 7, the device is separated from an adjacent device along an element separation region 10a. At this time, the element separation region 10a may be notched through dicing, for separating the device from the adjacent device along the notch. Alternatively, the element separation region 10a may be notched through etching, for separating the device from the adjacent device. Further alternatively, the element separation region 10a of the conductive substrate 1 may be notched by dicing while notching the element separation region 10a of the nitride-based semiconductor element layer 10 by etching, for separating the device from the adjacent device along the notches formed by dicing and etching respectively. When dicing and etching are combined with each other as described above, no cutter comes into contact with the nitride-based semiconductor element layer 10, so that damage on the nitride-based semiconductor element layer 10 is reduced. Thus, the nitride-based semiconductor light-emitting diode device according to the first embodiment is formed as shown in FIG. 1.

Second Embodiment

Figure 8:
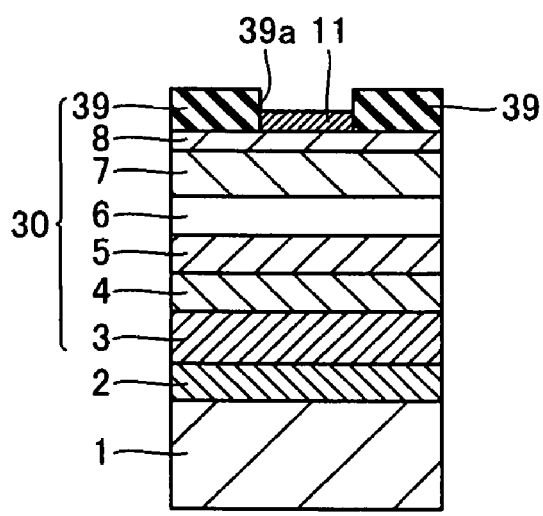
FIG. 8 is a sectional view showing the structure of a nitride-based semiconductor light-emitting diode device according to a second embodiment of the present invention.

Referring to FIG. 8, a nitride-based semiconductor light-emitting diode device according to a second embodiment employs a light transmission layer 39 of undoped GaN, dissimilarly to the aforementioned first embodiment.

According to the second embodiment, a p-side electrode 2 having a composition and a thickness similar to those in the aforementioned first embodiment is bonded onto a conductive substrate 1, as shown in FIG. 8. Nitride-based semiconductor layers 3 to 8 having compositions and thicknesses similar to those in the aforementioned first embodiment respectively are formed on the p-side electrode 2.

According to the second embodiment, the light transmission layer 39 of undoped GaN having a thickness of about 1 nm to about 2 μm is formed on the n-type contact layer 8. This light transmission layer 39 has an opening 39a. The p-type contact layer 3, the p-type cladding layer 4, the cap layer 5, the active layer 6, the n-type cladding layer 7, the n-type contact layer 8 and the light transmission layer 39 constitute a nitride-based semiconductor element layer 30. An n-side electrode 11 having a composition and a thickness similar to those in the aforementioned first embodiment is formed in the opening 39a of the light transmission layer 39, to be in contact with the surface of the n-type contact layer 8.

In the nitride-based semiconductor light-emitting diode device according to the second embodiment shown in FIG. 8, the surface of the light transmission layer 9 serves as a light emission surface.

According to the second embodiment, as hereinabove described, the light transmission layer 39 of undoped GaN formed with no impurity levels resulting from impurity doping can be more inhibited from light absorption resulting from impurity levels as compared with the aforementioned first embodiment. Thus, light totally reflected on the light emission surface (surface of the light transmission layer 39) can be more inhibited from absorption, whereby light extraction efficiency can be further improved.

The remaining effects of the second embodiment are similar to those of the aforementioned first embodiment.

A manufacturing process for the nitride-based semiconductor light-emitting diode device is now described with reference to FIGS. 8 to 13.

Figure 9:
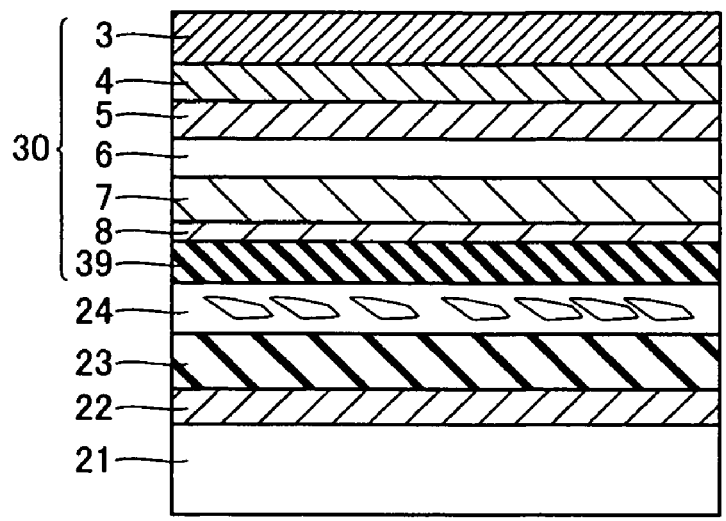
FIGS. 9 to 13 are sectional views for illustrating a manufacturing process for the nitride-based semiconductor light-emitting diode device according to the second embodiment shown in FIG. 8.

As shown in FIG. 9, a buffer layer 22 and an underlayer 23 having compositions and thicknesses similar to those in the aforementioned first embodiment respectively are successively grown on the (0001) plane of a sapphire substrate 21 employed as a growth substrate by MOCVD. Thereafter an isolation layer (gap layer) 24 of InGaN or AlGaN having a thickness of about 1 nm to about 1 μm and including spaces therein is grown on the underlayer 23. At this time, the spaces may be formed in the isolation layer 24 by anodic oxidation or etching, or a porous or amorphous isolation layer 24 having inferior crystallinity (including a large number of cracks) may be formed. The porous isolation layer 24 can be formed by adjusting growth conditions or implanting ions. The amorphous isolation layer 24 can be formed by low-temperature growth. Alternatively, the isolation layer 24 may be formed by a metal film or an insulating film having clearances. Then, the light transmission layer 39 of undoped GaN having the thickness of about 1 nm to about 2 μm is grown on the isolation layer 24, and the n-type contact layer 8, the n-type cladding layer 7, the active layer 6, the cap layer 5, the p-type cladding layer 4 and the p-type contact layer 3 having compositions and thicknesses similar to those in the aforementioned first embodiment respectively are thereafter successively grown on the light transmission layer 39. Thereafter the p-type cladding layer 4 and the p-type contact layer 3 are converted to the p type.

Figure 10:
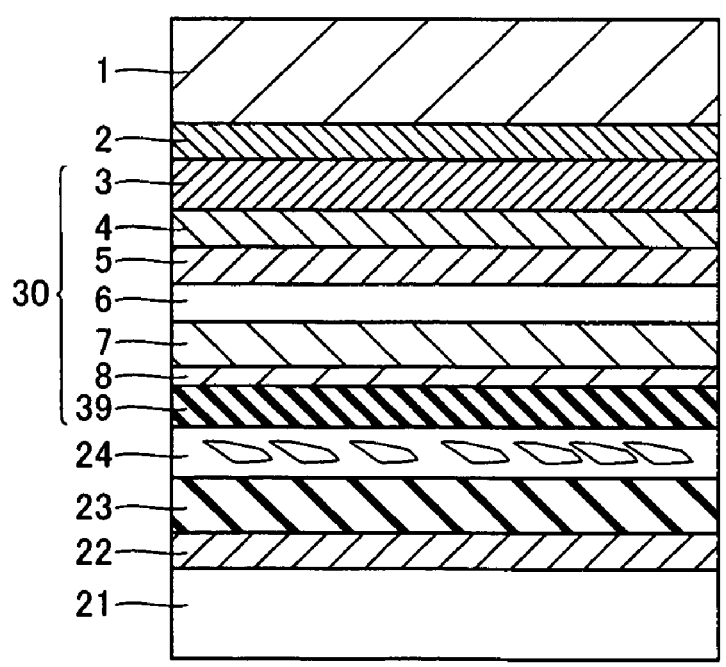
Figure 11:
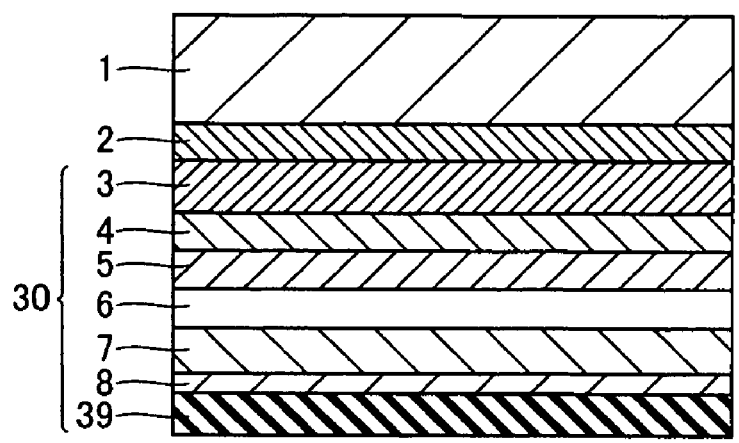

As shown in FIG. 10, the p-side electrode 2 having the composition and the thickness similar to those in the aforementioned embodiment is formed on the p-type contact layer 3 by vacuum evaporation or the like, and the conductive substrate 1 is bonded onto the p-side electrode 2 through a process similar to that of the first embodiment shown in FIG. 4. Thereafter the nitride-based semiconductor element layer 30 located on the isolation layer 24 is separated from the layers (the sapphire substrate 21, the buffer layer 22 and the underlayer 23) located under the isolation layer 24. At this time, the isolation layer 24 may be removed by wet etching with a mixture of an HF solution and an HNO$_3$ solution or by externally applying physical force. Further, the nitride-based semiconductor element layer 30 located on the isolation layer 24 and the layers (21 to 23) located under the isolation layer 24 may be separated from each other by oppositely pulling the same. Thus, the surface of the light transmission layer 39 is exposed as shown in FIG. 11.

Figure 12:
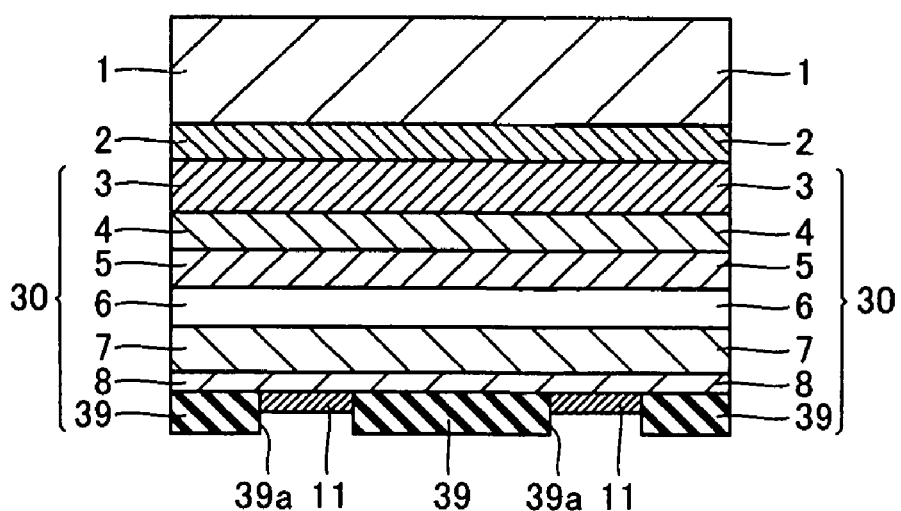

As shown in FIG. 12, the opening 39a is formed on a prescribed region of the light transmission layer 39 by etching, to expose the surface of the n-type contact layer 8. Thereafter the n-side electrode 11 having the composition and the thickness similar to those in the aforementioned first embodiment is formed in the opening 39a of the light transmission layer 39 by vacuum evaporation or the like, to be in contact with the exposed surface of the n-type contact layer 8.

Figure 13:
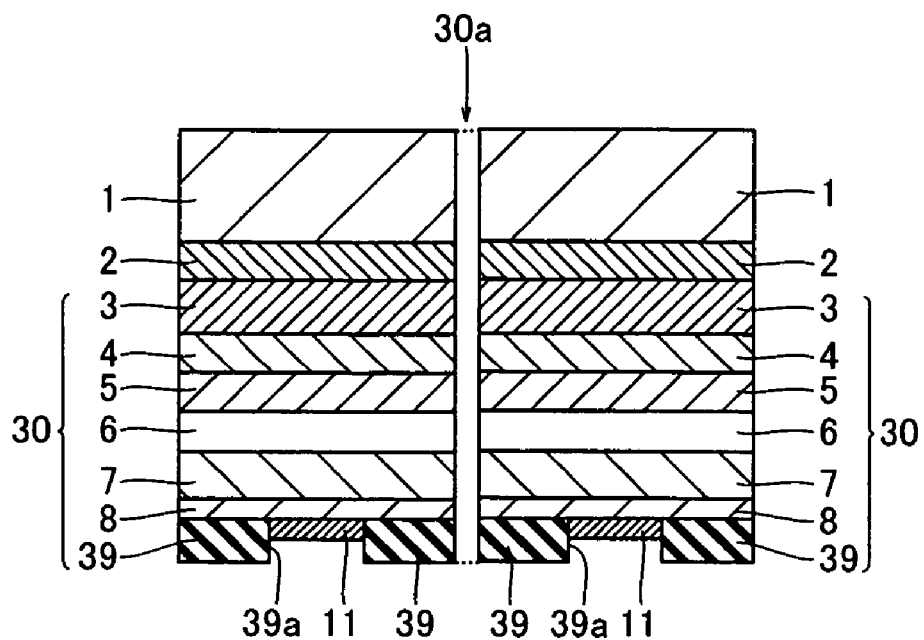

As shown in FIG. 13, the device is separated from an adjacent device along an element separation region 30a, through a process similar to that of the first embodiment shown in FIG. 7. Thus, the nitride-based semiconductor light-emitting diode device according to the second embodiment is formed as shown in FIG. 8.

Third Embodiment

Figure 14:
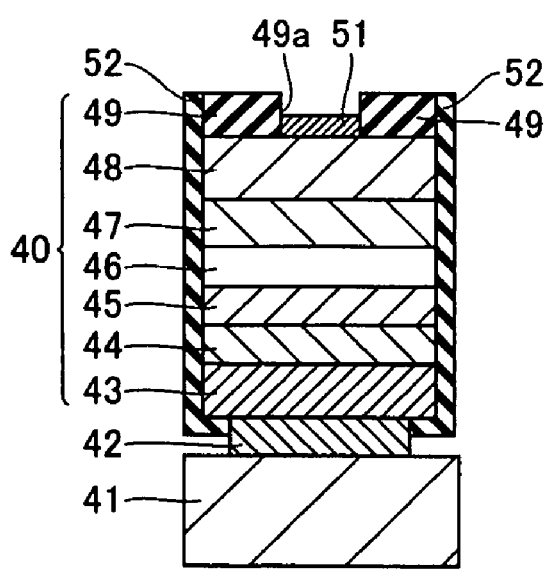
FIG. 14 is a sectional view showing the structure of a nitride-based semiconductor light-emitting diode device according to a third embodiment of the present invention.

Referring to FIG. 14, a nitride-based semiconductor light-emitting diode device according to a third embodiment of the present invention employs a light transmission layer 49 of undoped AlGaN, dissimilarly to the aforementioned first and second embodiments.

According to the third embodiment, a p-side electrode 42 having a composition and a thickness similar to those of the n-side electrode 2 of the aforementioned first embodiment with a width smaller than that of a conductive substrate 41 is bonded onto the conductive substrate 41, as shown in FIG. 14. The p-side electrode 42 is an example of the "first electrode layer" in the present invention. This p-side electrode 42 functions also as a reflecting film. A p-type contact layer 43, a p-type cladding layer 44, a cap layer 45, an active layer 46, an n-type cladding layer 47 and an n-type contact layer 48 having widths smaller than that of the conductive substrate 41 and larger than that of the p-side electrode 42 are successively formed on the p-side electrode 42. The p-type contact layer 43, the p-type cladding layer 44, the cap layer 45, the active layer 46, the n-type cladding layer 47 and the n-type contact layer 48 have compositions and thicknesses similar to those of the p-type contact layer 3, the p-type cladding layer 4, the cap layer 5, the active layer 6, the n-type cladding layer 7 and the n-type contact layer 8 in the aforementioned first embodiment respectively. The n-type cladding layer 47 and the n-type contact layer 48 have the same carrier concentrations (about $5 \times 10^{18}$ cm$^{-3}$) as the n-type cladding layer 7 and the n-type contact layer 8 in the aforementioned first embodiment. The p-type contact layer 43, the p-type cladding layer 44 and the cap layer 45 are examples of the "first nitride-based semiconductor layer" in the present invention, and the n-type cladding layer 47 and the n-type contact layer 48 are examples of the "second nitride-based semiconductor layer" in the present invention.

According to the third embodiment, the light transmission layer 49 of undoped AlGaN having a thickness of about 1 nm to about 2 μm is formed on the n-type contact layer 48. The light transmission layer 49 has an opening 49a. The p-type contact layer 43, the p-type cladding layer 44, the cap layer 45, the active layer 46, the n-type cladding layer 47, the n-type contact layer 48 and the light transmission layer 49 constitute a nitride-based semiconductor element layer 40. An n-side electrode 51 having a composition and a thickness similar to those of the n-side electrode 11 in the aforementioned first embodiment is formed in the opening 49a of the light transmission layer 49, to be in contact with the surface of the n-type contact layer 48. The n-side electrode 51 is an example of the "second electrode layer" in the present invention. A protective film 52 of SiO$_2$, SiN, TiO$_2$ or ZrO having a thickness of about 300 nm is formed on regions other than the light transmission layer 49 and the upper surface of the n-side electrode 51, to cover the nitride-based semiconductor element layer 40.

In the nitride-based semiconductor light-emitting diode device according to the third embodiment shown in FIG. 14, the surface of the light transmission layer 49 serves as a light emission surface.

According to the third embodiment, as hereinabove described, the light transmission layer 49 of undoped AlGaN formed with no impurity levels resulting from impurity doping can be more inhibited from light absorption resulting from impurity levels as compared with the aforementioned first embodiment, similarly to the aforementioned second embodiment. Thus, light to tally reflected on the light emission surface (surface of the light transmission layer 49) can be further inhibited from absorption, whereby light extraction efficiency can be further improved. Further, the nitride-based semiconductor layer of AlGaN constituting the light transmission layer 49, having a band gap larger than that of a nitride-based semiconductor layer of GaN or InGaN, has a smaller absorption end than the nitride-based semiconductor layer of GaN or InGaN. Therefore, the nitride-based semiconductor layer of AlGaN exhibits a shorter wavelength allowing no passage of light as compared with the nitride-based semiconductor layer of GaN or InGaN. According to the third embodiment employing the light transmission layer 49 of undoped AlGaN, therefore, the range of optical wavelengths causing no light absorption on the light transmission layer 49 can be widened. Thus, the range for setting the emission wavelength of the nitride-based semiconductor light-emitting diode device can be easily widened.

When the n-type contact layer 48 of GaN or AlGaN is prepared from AlGaN identically to the light transmission layer 49 in the third embodiment, the refractive indices of the light transmission layer 49 and the n-type contact layer 48 can be so substantially equalized with each other that the interface between the light transmission layer 49 and the n-type contact layer 48 can be inhibited from light reflection resulting from different refractive indices. Thus, the light extraction efficiency can be further improved.

The remaining effects of the third embodiment are similar to those of the aforementioned first embodiment.

A manufacturing process for the nitride-based semiconductor light-emitting diode device according to the third embodiment is now described with reference to FIGS. 14 to 21.

Figure 15:
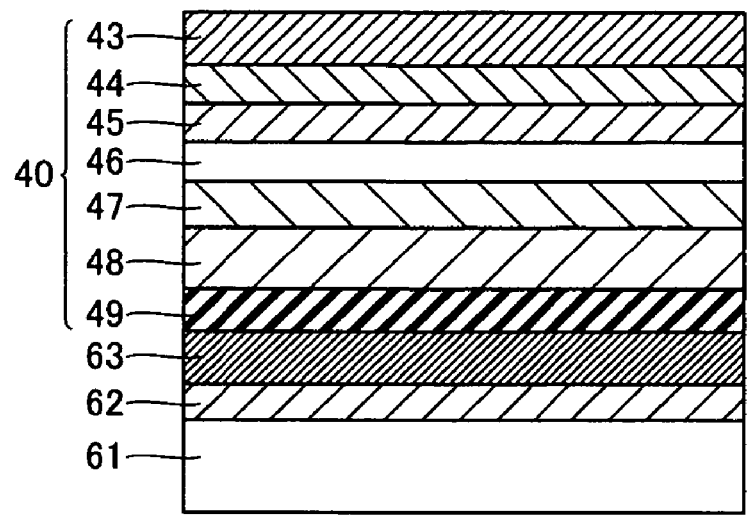
FIGS. 15 to 21 are sectional views for illustrating a manufacturing process for the nitride-based semiconductor light-emitting diode device according to the third embodiment shown in FIG. 14.

As shown in FIG. 15, a buffer layer 62 having a composition and a thickness similar to those of the buffer layer 22 in the aforementioned first embodiment is grown on an SiC substrate 61 employed as a growth substrate by MOCVD. Thereafter an isolation layer 63 of InGaN having a thickness of about 1 nm to about 1 μm with a high In composition ratio ($In_XGa_{1-X}N$ (X≧0.2) when the second harmonic (wavelength: 532 nm) of a YAG laser is employed, for example) capable of efficiently absorbing a laser beam of a prescribed wavelength is grown on the buffer layer 62. Then, the light transmission layer 49 of undoped AlGaN having the thickness of about 1 nm to about 2 μm is grown on the isolation layer 63, and the n-type contact layer 48, the n-type cladding layer 47, the active layer 46, the cap layer 45, the p-type cladding layer 44 and the p-type contact layer 43 are successively grown on the light transmission layer 49. Thereafter the p-type cladding layer 44 and the p-type contact layer 43 are converted to the p type.

Figure 16:
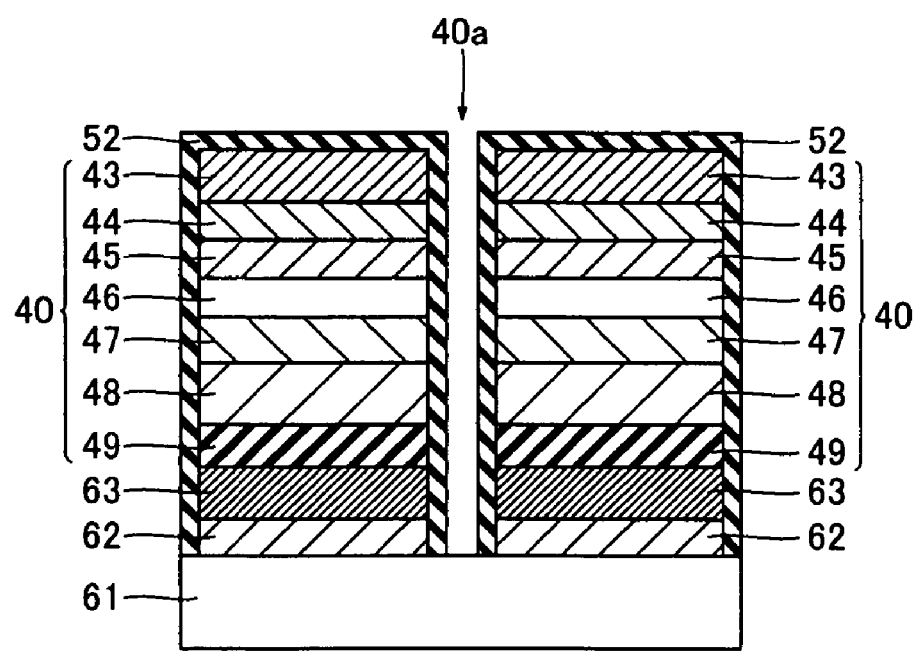

As shown in FIG. 16, a trench having a depth reaching the SiC substrate 61 is formed in an element separation region 40a by etching, thereby parting the nitride-based semiconductor element layer 40 through the trench. The trench formed in the element separation region 40a may not have the depth reaching the SiC substrate 61. Thereafter the protective film 52 is formed by CVD to cover the nitride-based semiconductor element layer 40, the isolation layer 63 and the buffer layer 62.

Figure 17:
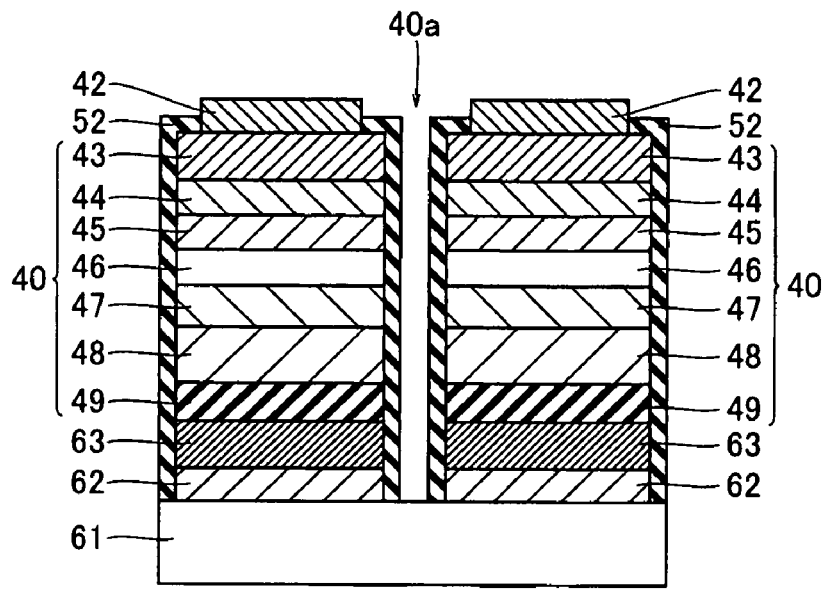

As shown in FIG. 17, a prescribed region of the protective film 52 located on the upper surface of the p-type contact layer 43 constituting the nitride-based semiconductor element layer 40 is removed and the p-side electrode 42 is thereafter formed on the exposed upper surface of the p-type contact layer 43 by vacuum evaporation or the like.

Figure 18:
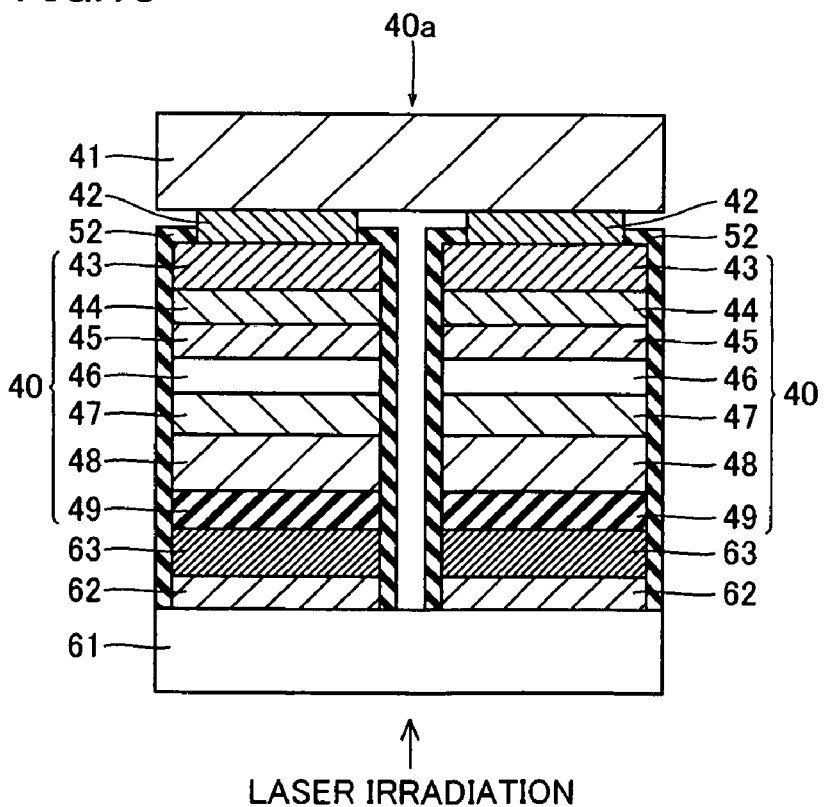

As shown in FIG. 18, the conductive substrate 41 is bonded onto the upper surface of the p-side electrode 42 through a process similar to that of the first embodiment shown in FIG. 4. Thereafter the nitride-based semiconductor element layer 40 located on the isolation layer 63 is separated from the layers (the SiC substrate 61 and the buffer layer 62) located under the isolation layer 63. At this time, a high-output laser such as a KrF excimer laser, a YAG laser, a DPSS laser (diode laser pumped solid-state laser) or a nitrogen laser is employed for applying a laser beam from the side of the SiC substrate 61, so that the isolation layer 63 absorbs the laser beam. Thus, the isolation layer 63 is decomposed to separate the nitride-based semiconductor element layer 40 located on the isolation layer 63 and the layers (the SiC substrate 61 and the buffer layer 62) located under the isolation layer 63 from each other by heat.

Figure 19:
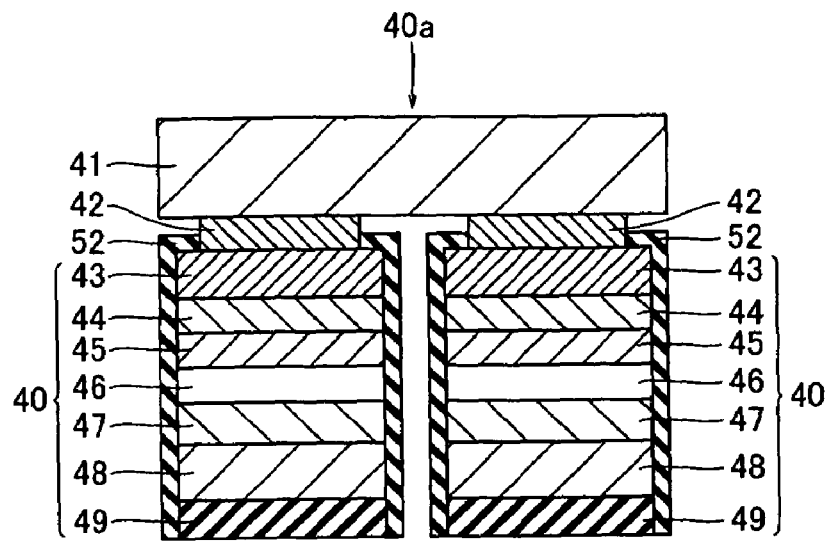

According to the third embodiment, the isolation layer 63 so consists of $In_{0.5}Ga_{0.5}N$ that a laser beam is transmitted through the SiC substrate 61 and the buffer layer 62 and absorbed by the isolation layer 63 when the second harmonic (wavelength: 532 nm) of a YAG laser is applied from the side of the SiC substrate 61. Thus, isolation through the isolation layer 63 can be simplified by properly designing the band gap of the isolation layer 63 and the wavelength of the applied laser beam. Therefore, the isolation layer 63 can most efficiently absorb the laser beam among the semiconductor layers shown in FIG. 18, for easily performing isolation. Thus, the surface of the light transmission layer 49 is exposed as shown in FIG. 19.

Figure 20:
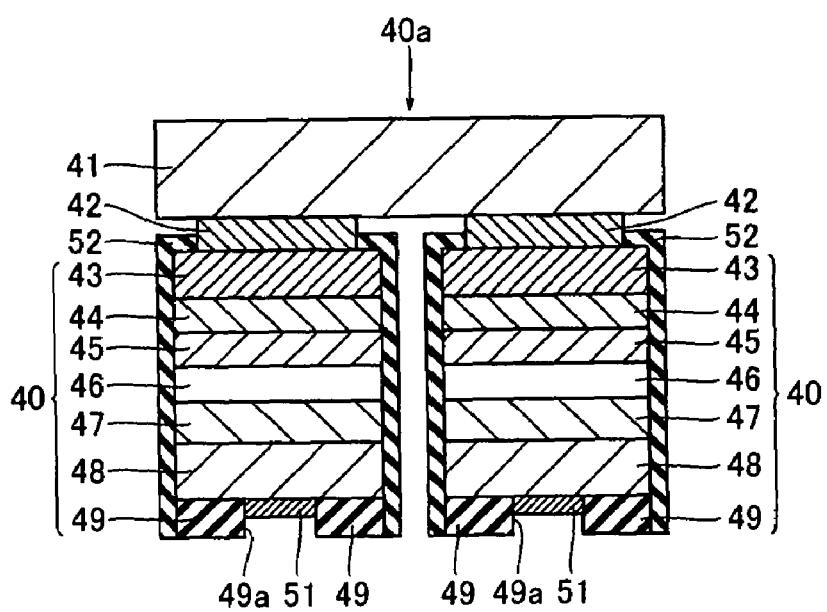

As shown in FIG. 20, the opening 49a is formed on a prescribed region of the light transmission layer 49 by etching, to expose the surface of the n-type contact layer 49. Thereafter the n-side electrode 51 is formed in the opening 49a of the light transmission layer 49 by vacuum evaporation or the like, to be in contact with the exposed surface of the n-type contact layer 48.

Figure 21:
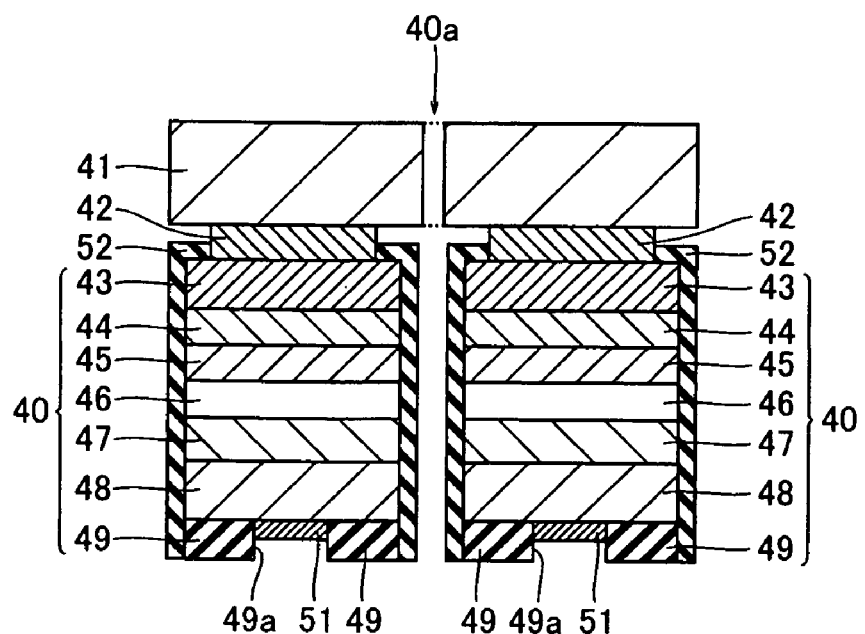

As shown in FIG. 21, the device is separated from an adjacent device along the element separation region 40a through a process similar to that of the first embodiment shown in FIG. 7. Thus, the nitride-based semiconductor light-emitting diode device according to the third embodiment is formed as shown in FIG. 14.

Fourth Embodiment

Figure 22:
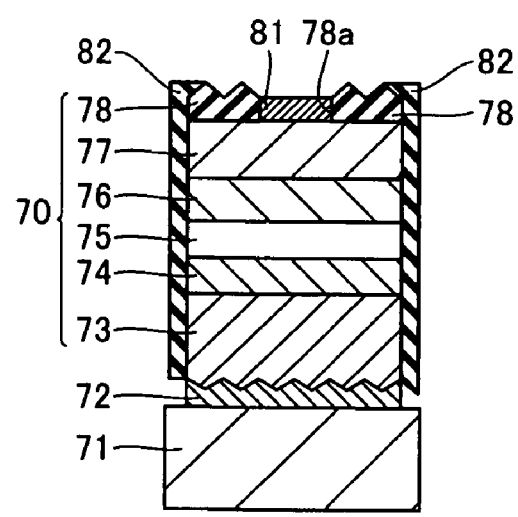
FIG. 22 is a sectional view showing the structure of a nitride-based semiconductor light-emitting diode device according to a fourth embodiment of the present invention.

Referring to FIG. 22, a nitride-based semiconductor light-emitting diode device according to a fourth embodiment of the present invention employs a light transmission layer 78 having a textured surface, dissimilarly to the aforementioned first to third embodiments.

According to the fourth embodiment, a p-side electrode 72 having a composition and a thickness similar to those of the p-side electrode 2 of the aforementioned first embodiment is bonded onto a conductive substrate 71, as shown in FIG. 22. The p-side electrode 72 is an example of the "first electrode layer" in the present invention. This p-side electrode 72 functions also as a reflecting film. The p-side electrode 72 has a textured surface, with a width smaller than that of the conductive substrate 71. The width between adjacent projecting and recess portions of the textured surface of the p-side electrode 72 is about 0.1 μm to about 50 μm, and the height of the projecting portions from the bottoms of the recess portions is about 1 nm to about 2 μm. A p-type contact layer 73 functioning as a cladding layer is formed on the p-side electrode 72, to fill up the recess portions of the surface of the p-side electrode 72. The p-type contact layer 73 consists of GaN, AlGaN or InGaN doped with Mg, and has a thickness of about 1 nm to about 1 μm. The p-type contact layer 73 may alternatively consist of undoped InGaN. A cap layer 74, an active layer 75, an n-type cladding layer 76 and an n-type contact layer 77 are successively formed on the p-type contact layer 73. The cap layer 74, the active layer 75, the n-type cladding layer 76 and the n-type contact layer 77 have compositions and thicknesses similar to those of the cap layer 4, the active layer 6, the n-type cladding layer 7 and the n-type contact layer 8 in the aforementioned first embodiment respectively. The n-type cladding layer 76 and the n-type contact layer 77 have the same carrier concentrations (about $5 \times 10^{18}$ cm$^{-3}$) as the n-type cladding layer 7 and the n-type contact layer 8 in the aforementioned first embodiment. The p-type contact layer 73 and the cap layer 74 are examples of the "first nitride-based semiconductor layer" in the present invention, and the n-type cladding layer 76 and the n-type contact layer 77 are examples of the "second nitride-based semiconductor layer" in the present invention.

According to the fourth embodiment, the light transmission layer 78 of undoped GaN having the thickness of about 1 nm to about 2 μm is formed on the n-type contact layer 77. This light transmission layer 78 has the textured surface, and includes an opening 78a. The width of a portion between the centers of each adjacent pair of projecting and recess portions of the textured surface of the light transmission layer 78 is about 0.1 μm to about 50 μm, and the height of the projecting portions from the bottoms of the recess portions is about 1 nm to about 2 μm. The p-type contact layer 73, the cap layer 74, the active layer 75, the n-type cladding layer 76, the n-type contact layer 77 and the light transmission layer 78 constitute a nitride-based semiconductor element layer 70. An n-side electrode 81 having a composition and a thickness similar to those of the n-side electrode 11 in the aforementioned first embodiment is formed in the opening 78a of the light transmission layer 78, to be in contact with the surface of the n-type contact layer 77. The n-side electrode 81 is an example of the "second electrode layer" in the present invention. A protective film 82 having a composition and a thickness similar to those of the protective film 52 in the aforementioned third embodiment is formed on the side surfaces of the nitride-based semiconductor element layer 70.

In the nitride-based semiconductor light-emitting diode device according to the fourth embodiment shown in FIG. 22, the surface of the light transmission layer 78 serves as a light emission surface.

According to the fourth embodiment, as hereinabove described, the light transmission layer 78 of undoped GaN formed with no impurity levels resulting from impurity doping can be more inhibited from light absorption resulting from impurity levels as compared with the aforementioned first embodiment, similarly to the aforementioned second embodiment. Thus, light totally reflected on the light emission surface (surface of the light transmission layer 78) can be more inhibited from absorption, whereby light extraction efficiency can be further improved.

According to the fourth embodiment, further, the light transmission layer 78 is formed to have the textured surface so that the surface of the light transmission layer 78 serving as the light emission surface can be inhibited from totally reflecting light, whereby the light extraction efficiency can be more improved.

According to the fourth embodiment, in addition, the surface of the nitride-based semiconductor element layer 70 closer to the p-side electrode 72 functioning as a reflecting film is so textured that light incident upon the interface between the p-side electrode 72 and the nitride-based semiconductor element layer 70 is easily reflected, whereby the quantity of light emitted from the light emission surface opposite to the p-side electrode 72 can be increased.

The remaining effects of the fourth embodiment are similar to those of the aforementioned first embodiment.

A manufacturing process for the nitride-based semiconductor light-emitting diode device according to the fourth embodiment is now described with reference to FIGS. 22 to 30.

Figure 23:
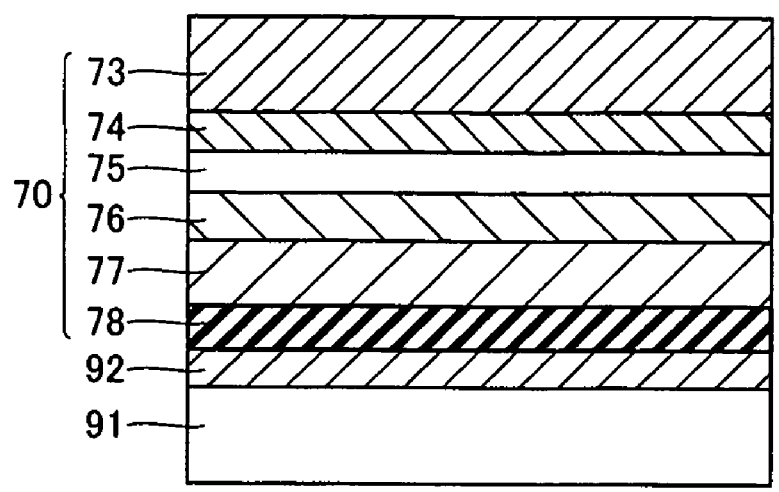
FIGS. 23 to 30 are sectional views for illustrating a manufacturing process for the nitride-based semiconductor light-emitting diode device according to the fourth embodiment shown in FIG. 22.

As shown in FIG. 23, a buffer layer 92 having a composition and a thickness similar to those of the buffer layer 22 in the aforementioned first embodiment is grown on an Si substrate 91 employed as a growth substrate by MOCVD. Then, the light transmission layer 78 of undoped GaN having the thickness of about 1 nm to about 2 μm is grown on the buffer layer 92, and the n-type contact layer 77, the n-type cladding layer 76, the active layer 75, the cap layer 74 and the p-type contact layer 73 are thereafter successively grown on the light transmission layer 78. Thereafter the p-type contact layer 73 is converted to the p type.

Figure 24:
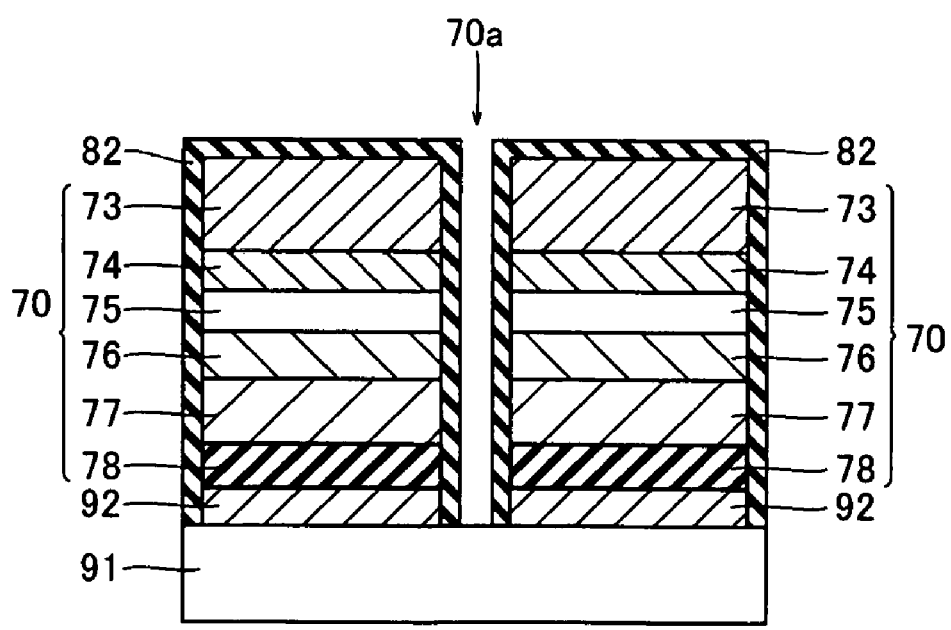

As shown in FIG. 24, a trench having a depth reaching the Si substrate 91 is formed in an element separation region 70a by etching, thereby parting the nitride-based semiconductor element layer 70 through the trench. Thereafter the protective film 82 is formed by CVD to cover the nitride-based semiconductor element layer 70 and the buffer layer 92.

Figure 25:
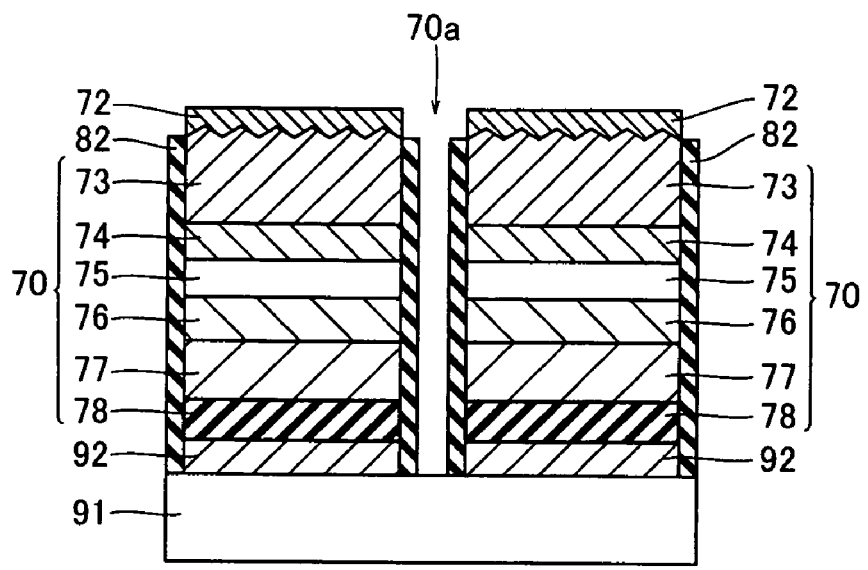

As shown in FIG. 25, a portion of the protective film 82 located on the upper surface of the p-type contact layer 73 constituting the nitride-based semiconductor element layer 70 is removed, and the exposed surface of the p-type contact layer 73 is thereafter textured by photolithography and dry etching. At this time, the surface of the p-type contact layer 73 is so textured that the width of a portion between the centers of the adjacent projecting and recess portions of the textured surface of the p-type contact layer 73 is about 0.1 μm to about 50 μm and the height of the projecting portions from the bottoms of the recess portions is about 1 nm to about 2 μm. Thereafter the p-side electrode 72 is formed by vacuum evaporation or the like, to fill up the recess portions of the surface of the p-type contact layer 73.

Figure 26:
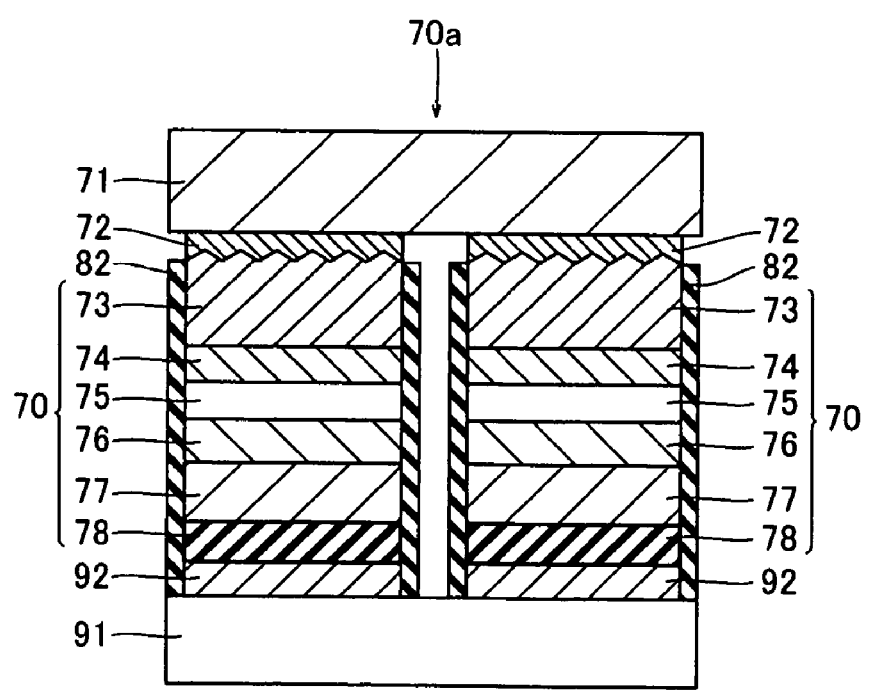
Figure 27:
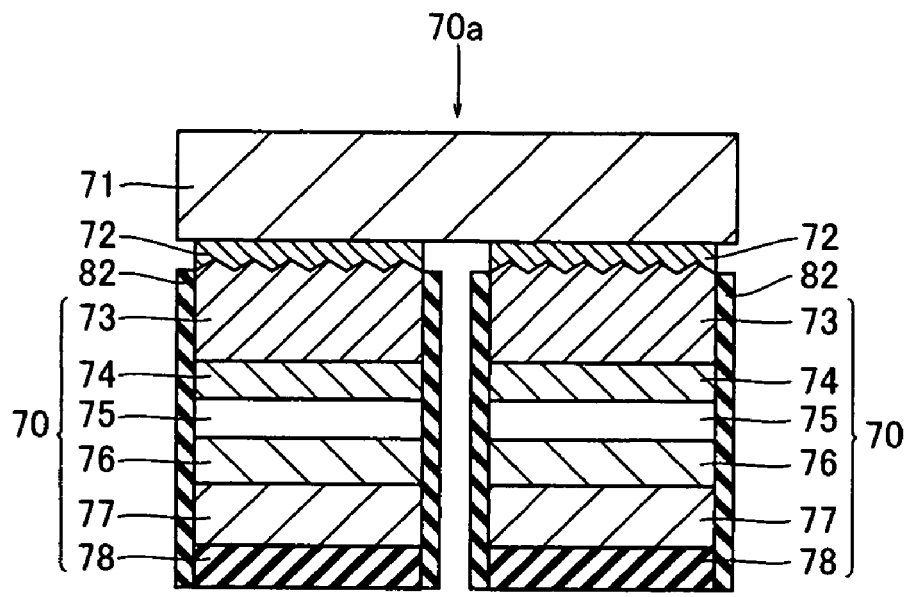

As shown in FIG. 26, the conductive substrate 71 is bonded onto the upper surface of the p-side electrode 72 through a process similar to that of the first embodiment shown in FIG. 4. Thereafter the Si substrate 91 and the buffer layer 92 are removed by wet etching with a hot phosphoric acid solution or the like. Thus, the surface of the light transmission layer 78 is exposed as shown in FIG. 27.

Figure 28:
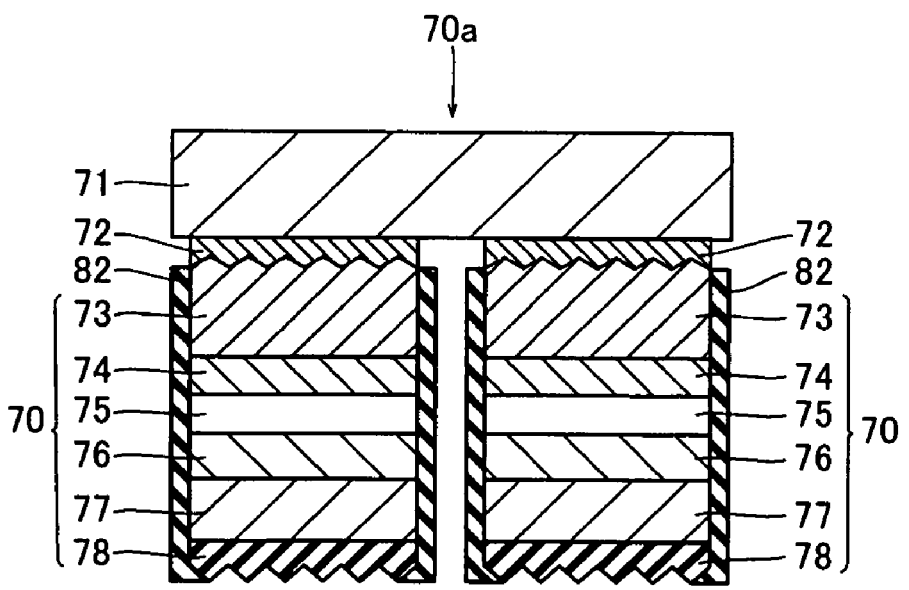

As shown in FIG. 28, the exposed surface of the light transmission layer 78 is textured by photolithography and dry etching. At this time, the surface of the light transmission layer 78 is so textured that the width of a portion between the centers of the adjacent projecting and recess portions of the textured surface of the light transmission layer 78 is about 0.1 μm to about 50 μm and the height of the projecting portions from the bottoms of the recess portions is about 1 nm to about 2 μm.

Figure 29:
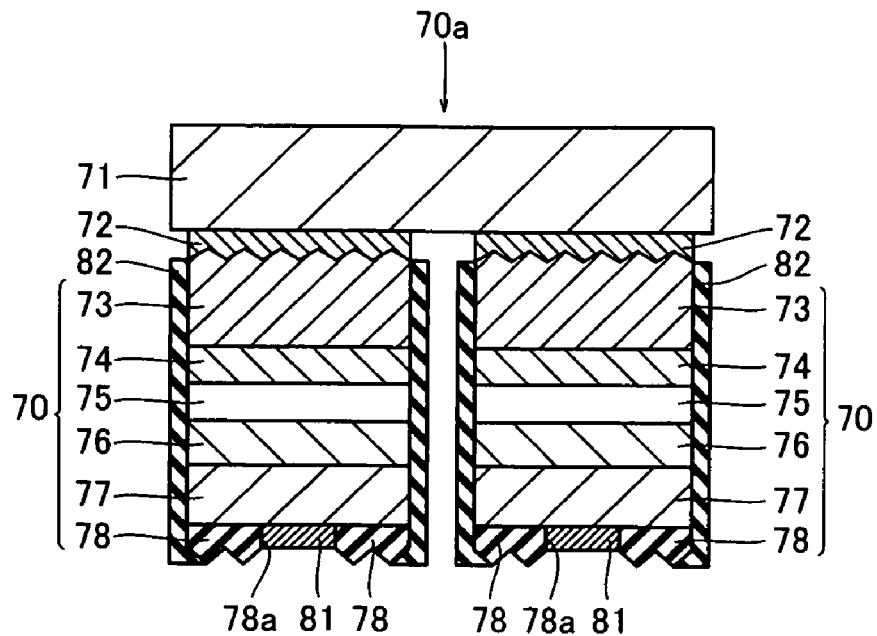

As shown in FIG. 29, the opening 78a is formed on a prescribed region of the light transmission layer 78 by etching, to expose the surface of the n-type contact layer 77. Thereafter the n-side electrode 81 is formed in the opening 78a of the light transmission layer 78 by vacuum evaporation or the like, to be in contact with the exposed surface of the n-type contact layer 77.

Figure 30:
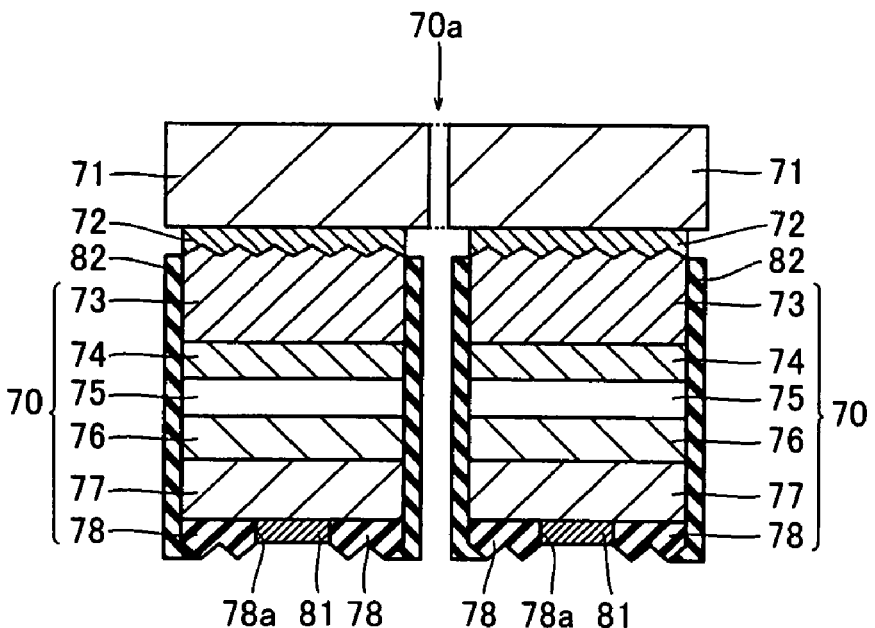

As shown in FIG. 30, the device is separated from an adjacent device along the element separation region 70a through a process similar to that of the first embodiment shown in FIG. 7. Thus, the nitride-based semiconductor light-emitting diode device according to the fourth embodiment is formed as shown in FIG. 22.

Fifth Embodiment

Figure 31:
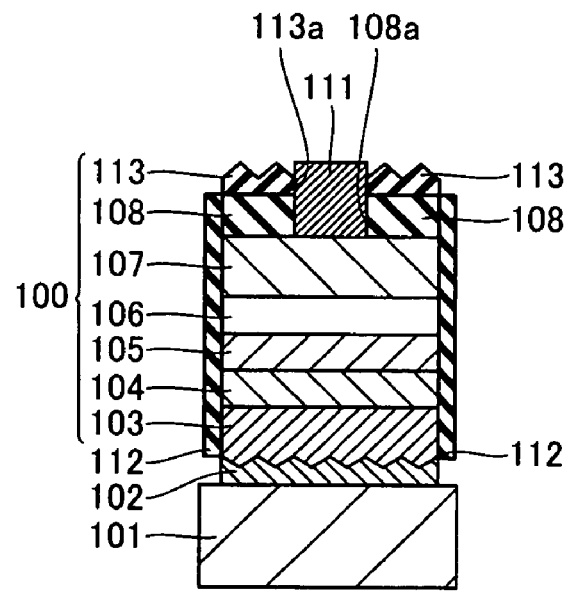
FIG. 31 is a sectional view showing the structure of a nitride-based semiconductor light-emitting diode device according to a fifth embodiment of the present invention.

Referring to FIG. 31, an insulating film 113 having a textured surface is formed on a light transmission layer 108 in a nitride-based semiconductor light-emitting diode device according to a fifth embodiment of the present invention, dissimilarly to the aforementioned first to fourth embodiment.

According to the fifth embodiment, a p-side electrode 102 having a composition and a thickness similar to those of the p-side electrode 2 in the aforementioned first embodiment is bonded onto a conductive substrate 101, as shown in FIG. 31. The p-side electrode 102 is an example of the "first electrode layer" in the present invention. This p-side electrode 102 functions also as a reflecting film. The p-side electrode 102 has a textured surface, with a width smaller than that of the conductive substrate 101. The width of a portion between the centers of each adjacent pair of projecting and recess portions of the textured surface of the p-side electrode 102 is about 0.1 µm to about 50 µm, and the height of the projecting portions from the bottoms of the recess portions is about 1 nm to about 2 µm. A p-type contact layer 103 is formed on the p-side electrode 102, to fill up the recess portions of the surface of the p-side electrode 102. A p-type cladding layer 104, a cap layer 105 and an active layer 106 are successively formed on the p-type contact layer 103. The p-type contact layer 103, the p-type cladding layer 104, the cap layer 105 and the active layer 106 have compositions and thicknesses similar to those of the p-type contact layer 3, the p-type cladding layer 4, the cap layer 5 and the active layer 6 in the aforementioned first embodiment respectively. An n-type contact layer 107 functioning as a cladding layer is formed on the active layer 106. The n-type contact layer 107 consists of AlGaN (Al composition ratio≦50%) doped with Si or Ge, and has a thickness of about 1 nm to about 1 µm. Further, the n-type contact layer 107 has the same carrier concentration (about $5 \times 10^{18}$ cm$^{-3}$) as the n-type contact layer 8 in the aforementioned first embodiment. The p-type contact layer 103, the p-type cladding layer 104 and the cap layer 105 are examples of the "first nitride-based semiconductor layer" in the present invention, and the n-type contact layer 107 is an example of the "second nitride-based semiconductor layer" in the present invention.

According to the fifth embodiment, the light transmission layer 108 of undoped GaN having a thickness of about 1 nm to about 2 µm is formed on the n-type contact layer 107. This light transmission layer 108 has an opening 180a. The p-type contact layer 103, the p-type cladding layer 104, the cap layer 105, the active layer 106, the n-type contact layer 107 and the light transmission layer 108 constitute a nitride-based semiconductor element layer 100.

According to the fifth embodiment, the insulating film 113 of SiO$_2$ or SiN having a thickness of about 1 µm is formed on the light transmission layer 108. This insulating film 113 has the textured surface, with an opening 113a. The width of a portion between the centers of each adjacent pair of projecting and recess portions of the textured surface of the insulating film 113 is about 0.1 µm to about 50 µm, and the height of the projecting portions from the bottoms of the recess portions is about 1 nm to about 2 µm. The insulating film 113 is an example of the "layer of a material other than a nitride-based semiconductor" in the present invention. An n-side electrode 111 having a composition and a thickness similar to those of the n-side electrode 11 in the aforementioned first embodiment is formed in the openings 113a and 108a of the insulating film 113 and the light transmission layer 108, to be in contact with the surface of the n-type contact layer 107. The n-side electrode 111 is an example of the "second electrode layer" in the present invention. A protective film 112 having a composition and a thickness similar to those of the protective film 52 in the aforementioned third embodiment is formed on the side surfaces of the nitride-based semiconductor element layer 100.

In the nitride-based semiconductor light-emitting diode device according to the fifth embodiment shown in FIG. 31, the surface of the insulating film 113 serves as a light emission surface.

According to the fifth embodiment, as hereinabove described, the light transmission layer 108 of undoped GaN formed with no impurity levels resulting from impurity doping can be more inhibited from light absorption resulting from impurity levels as compared with the aforementioned first embodiment, similarly to the aforementioned second embodiment. Thus, light totally reflected on the light emission surface (surface of the insulating film 113) can be more inhibited from absorption, whereby light extraction efficiency can be further improved.

According to the fifth embodiment, further, the insulating film 113 having the textured surface is so formed on the light transmission layer 108 that the surface of the insulating film 113 serving as the light emission surface can be inhibited from totally reflecting light, whereby the light extraction efficiency can be more improved.

According to the fifth embodiment, in addition, the light transmission layer 108 and the insulating film 113 are formed with the openings 108a and 113a respectively and the n-side electrode 111 is formed in the openings 108a and 113a of the light transmission layer 180 and the insulating film 113 to be in contact with the surface of the n-type contact layer 107 so that the n-side electrode 111 comes into contact with the n-type contact layer 107 having a high carrier concentration, whereby contact resistance of the n-side electrode 111 is not increased despite formation of the undoped light transmission layer 108 and the undoped insulating film 113.

According to the fifth embodiment, further, the surface of the p-side electrode 102 functioning as a reflecting film closer to the nitride-based semiconductor element layer 100 is so textured that light incident upon the interface between the p-side electrode 102 and the nitride-based semiconductor element layer 100 is easily reflected, whereby the quantity of light emitted from the light emission surface opposite to the p-side electrode 102 can be increased.

The remaining effects of the fifth embodiment are similar to those of the aforementioned first embodiment.

A manufacturing process for the nitride-based semiconductor light-emitting diode device according to the fifth embodiment is now described with reference to FIGS. 31 to 39.

Figure 32:
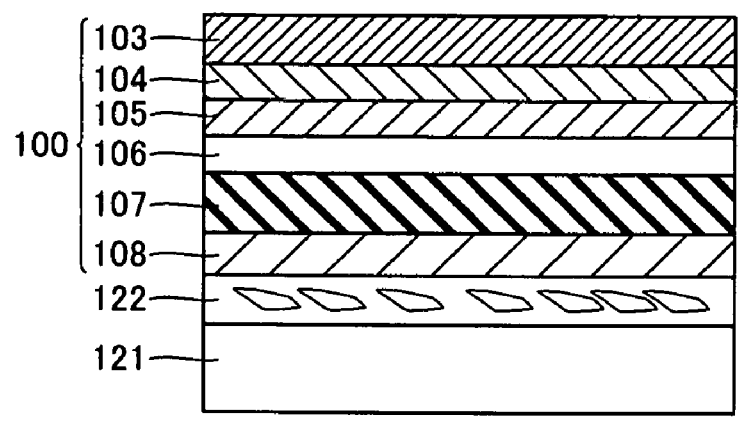
FIGS. 32 to 39 are sectional views for illustrating a manufacturing process for the nitride-based semiconductor light-emitting diode device according to the fifth embodiment shown in FIG. 31.

As shown in FIG. 32, an isolation layer (gap layer) 122 having a composition and a thickness similar to those of the isolation layer 24 in the aforementioned second embodiment and including spaces therein is grown on a GaN substrate 121 employed as a growth substrate by MOCVD. Then, the light transmission layer 108 of undoped GaN having the thickness of about 1 nm to about 2 µm is grown on the isolation layer 122, and the n-type contact layer 107, the active layer 106, the cap layer 105, the p-type cladding layer 104 and the p-type contact layer 103 are thereafter successively grown on the light transmission layer 108. Thereafter the p-type cladding layer 104 and the p-type contact layer 103 are converted to the p type.

Figure 33:
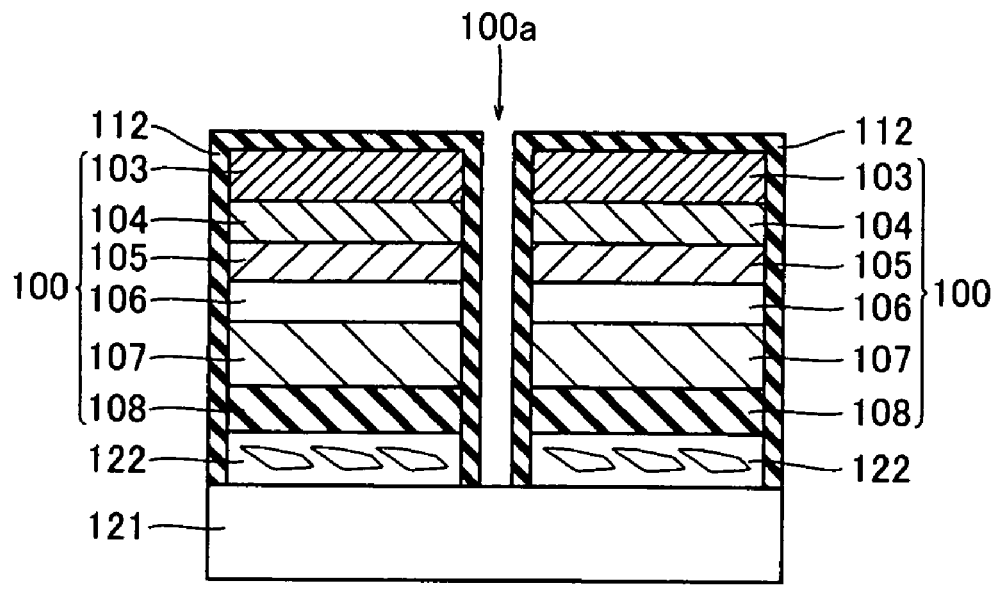

As shown in FIG. 33, a trench having a depth reaching the GaN substrate 121 is formed in an element separation region 100a by etching, thereby parting the nitride-based semiconductor element 100 through the trench. Thereafter the protective film 112 is formed by CVD to cover the nitride-based semiconductor element layer 100 and the isolation layer 122.

Figure 34:
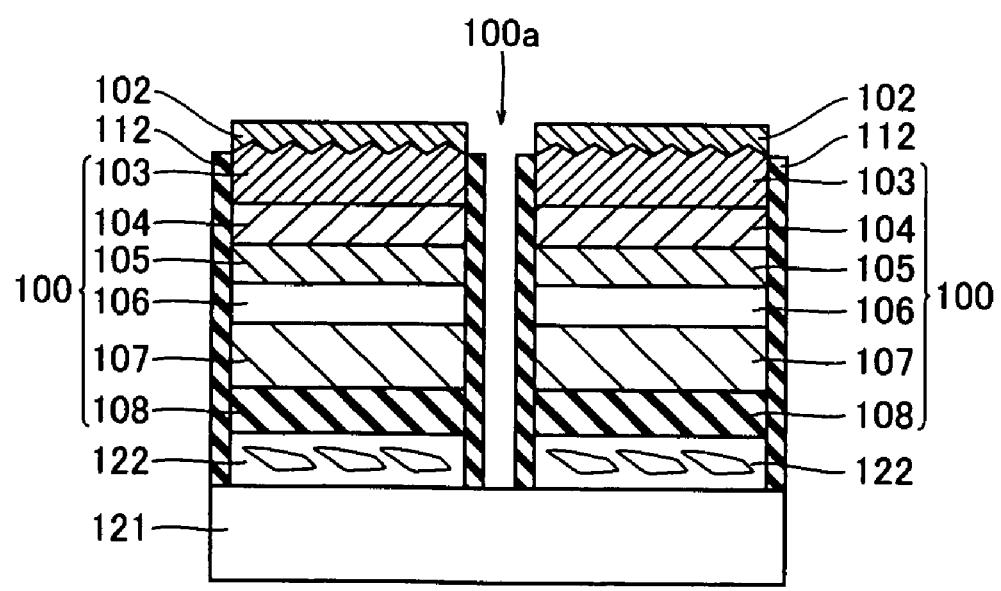

As shown in FIG. 34, a portion of the protective film 112 located on the upper surface of the p-type contact layer 103 constituting the nitride-based semiconductor element layer 100 is removed, and the exposed surface of the p-type contact layer 103 is textured by photolithography and dry etching. At this time, the surface of the p-type contact layer 103 is so textured that the width of the portion between the centers of the adjacent projecting and recess portions thereof is about 0.1 µm to about 50 µm and the height of the projecting portions from the bottoms of the recess portions is about 1 nm to about 2 µm. Thereafter the p-side electrode 102 is formed by vacuum evaporation or the like, to fill up the recess portions of the surface of the p-type contact layer 103.

Figure 35:
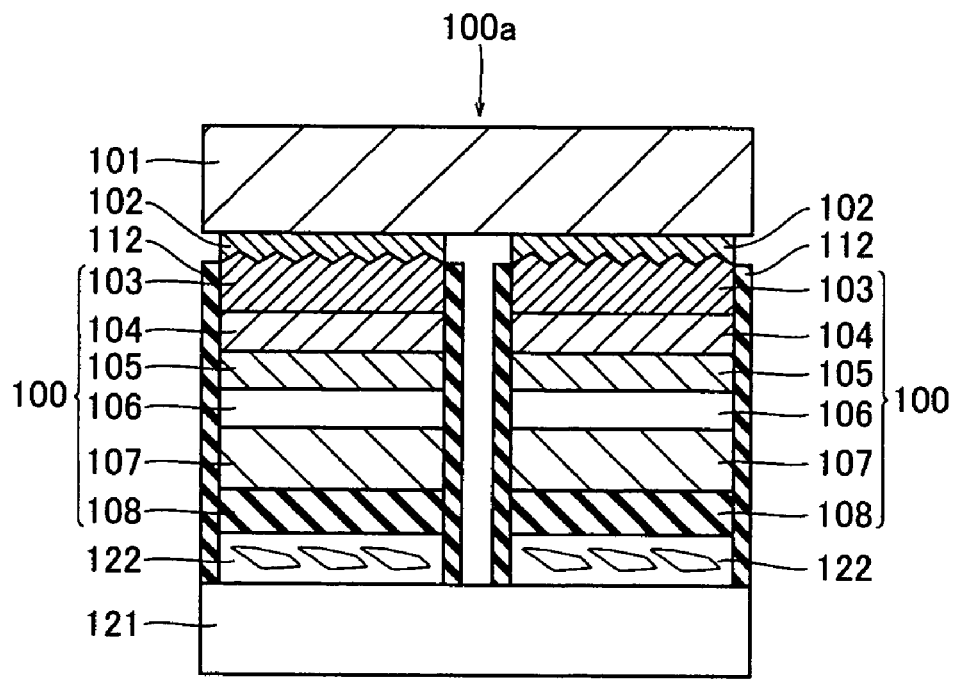
Figure 36:
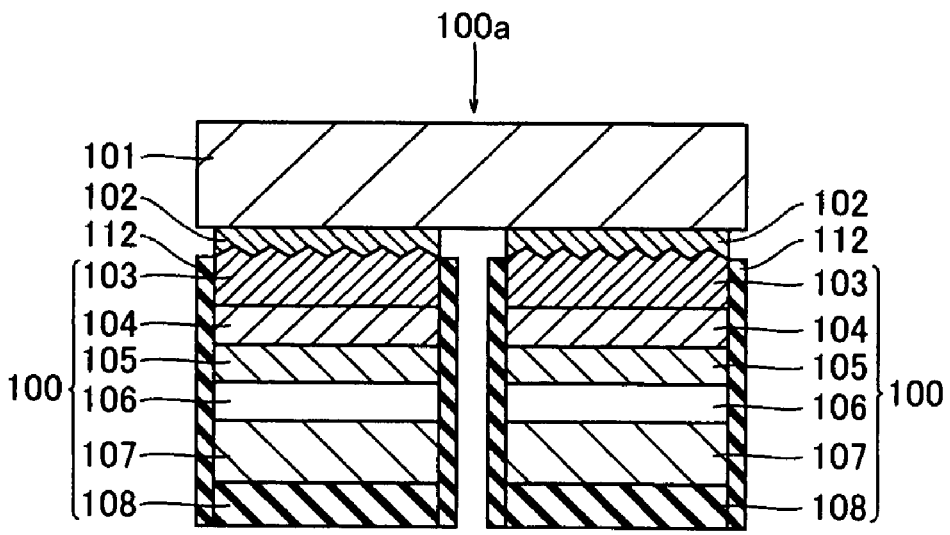

As shown in FIG. 35, the conductive substrate 101 is bonded onto the upper surface of the p-side electrode 102 through a process similar to that of the first embodiment shown in FIG. 4. Thereafter the nitride-based semiconductor element layer 100 located on the isolation layer 122 is separated from the GaN substrate 121 located under the isolation layer 122 through a process similar to that of the second embodiment shown in FIG. 10. Thus, the surface of the light transmission layer 108 is exposed as shown in FIG. 36.

Figure 37:
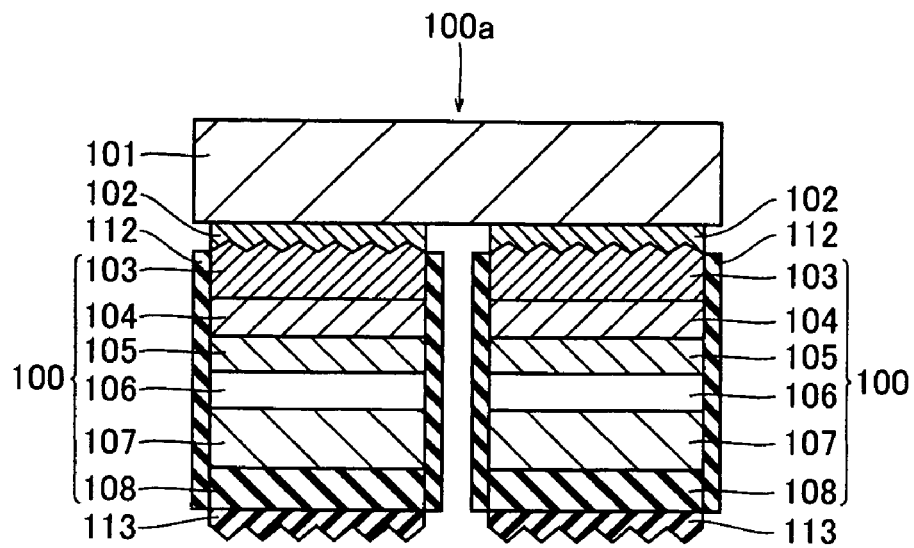

As shown in FIG. 37, the insulating film 113 is formed on the exposed surface of the light transmission layer 108 by CVD, and the surface of the insulating film 113 is thereafter textured by photolithography and dry etching. At this time, the surface of the insulating film 113 is so textured that the width of the portion between the centers of the adjacent projecting and recess portions thereof is about 0.1 µm to about 50 µm and the height of the projecting portions from the bottoms of the recess portions is about 1 nm to about 2 µm.

Figure 38:
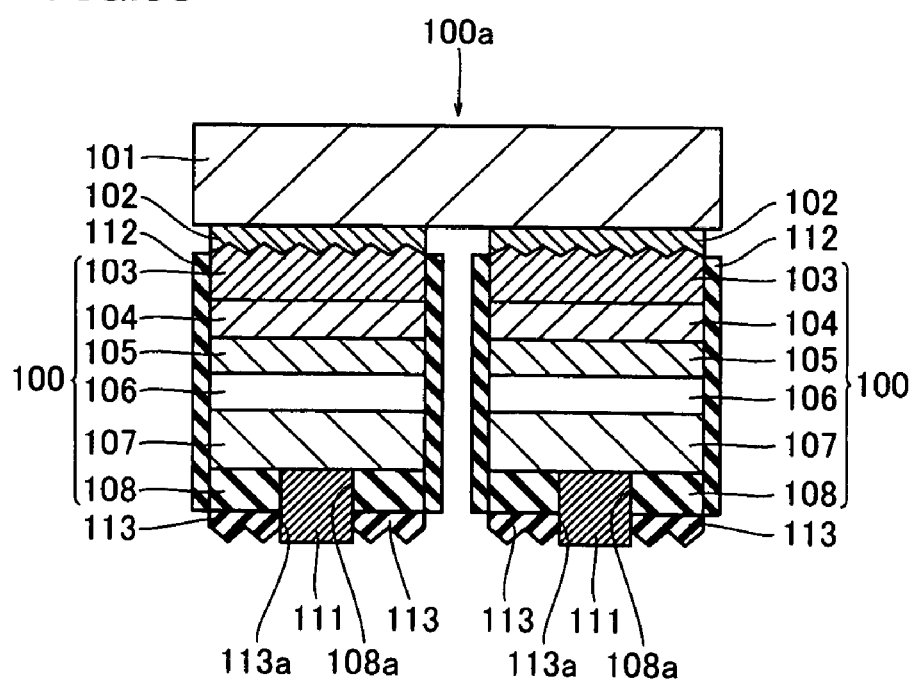

As shown in FIG. 38, the openings 113a and 108a are formed on prescribed regions of the insulating film 113 and the light transmission layer 108 respectively by etching, to expose the surface of the n-type contact layer 107. Thereafter the n-side electrode 111 is formed in the openings 113a and 108a of the insulating film 113 and the light transmission layer 108, to be in contact with the exposed surface of the n-type contact layer 107.

Figure 39:
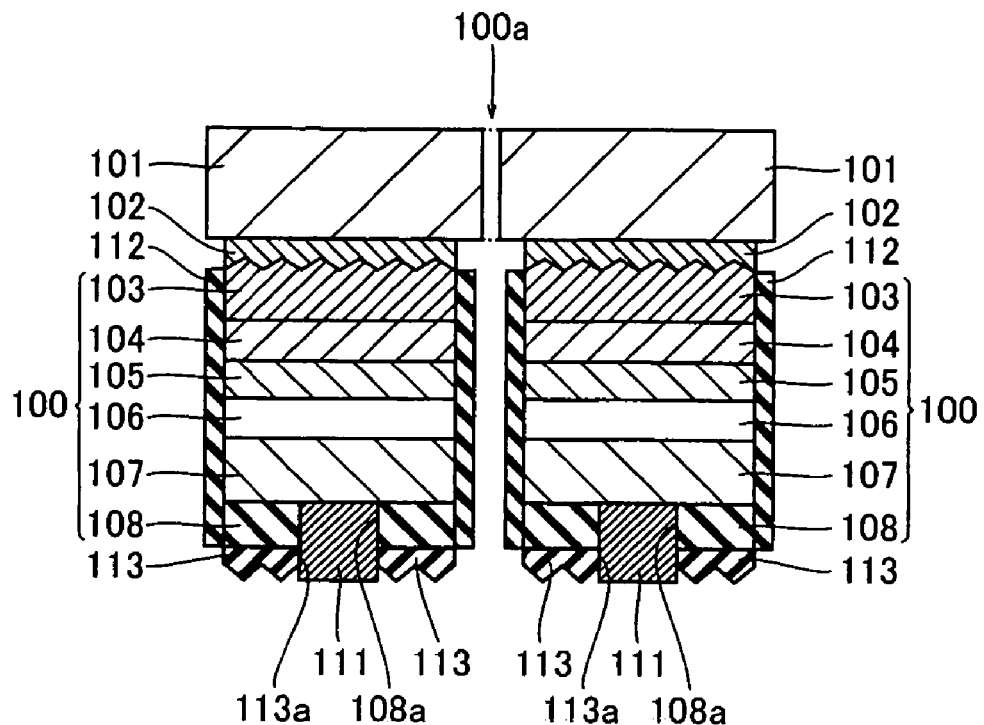

As shown in FIG. 39, the device is separated from an adjacent device along the element separation region 100a through a process similar to that of the first embodiment shown in FIG. 7. Thus, the nitride-based semiconductor light-emitting diode device according to the fifth embodiment is formed as shown in FIG. 31.

Sixth Embodiment

Figure 40:
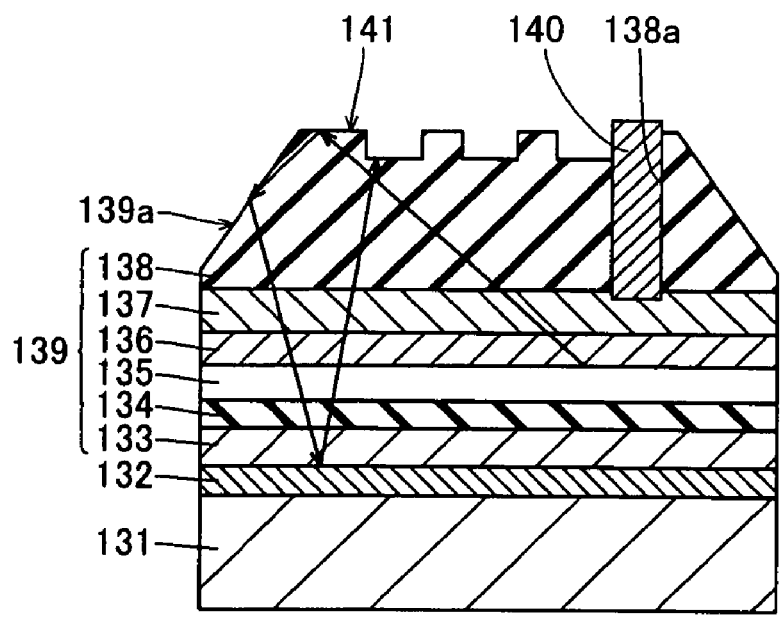
FIG. 40 is a sectional view showing the structure of a nitride-based semiconductor light-emitting diode device according to a sixth embodiment of the present invention.

Referring to FIG. 40, the side surfaces of a nitride-based semiconductor element layer 139 are inclined in a nitride-based semiconductor light-emitting diode device according to a sixth embodiment of the present invention, dissimilarly to the aforementioned first to fifth embodiments. Referring to FIG. 40, arrows denote paths of light.

In the nitride-based semiconductor light-emitting diode device according to the sixth embodiment, a conductive substrate 131 is set on a side opposite to a light emission surface 141, as shown in FIG. 40. A p-side electrode 132 obtained by successively forming an Ag layer having a thickness of about 200 nm and an Al layer having a thickness of about 5 nm from the side closer to the conductive substrate 131 is bonded onto the upper surface of the conductive substrate 131 through solder (not shown). The p-side electrode 132 is an example of the "first electrode layer" in the present invention. The p-side electrode 132 functions also as a reflecting film.

A p-type contact layer 133 of p-type GaN doped with Mg having a thickness of about 0.2 µm is formed on the p-side electrode 133. The p-type contact layer 133 functions also as a cladding layer. A cap layer 134 of undoped $Al_{0.05}Ga_{0.95}N$ having a thickness of about 5 nm is formed on the p-type contact layer 133. An active layer 135 having an MQW structure is formed on the cap layer 134. The active layer 135 has the MQW structure obtained by alternately stacking four barrier layers (not shown) of undoped GaN each having a thickness of about 10 nm and three well layers (not shown) of undoped $Ga_{0.85}In_{0.15}N$ each having a thickness of about 3 nm. An n-type cladding layer 136 of n-type $Al_{0.05}Ga_{0.95}N$ doped with Ge having a thickness of about 0.05 µm is formed on the active layer 135. An n-type contact layer 137 of n-type GaN doped with Ge having a thickness of about 0.5 µm is formed on the n-type cladding layer 136. The p-type contact layer 133 and the cap layer 134 are examples of the "first nitride-based semiconductor layer" in the present invention, and the n-type cladding layer 136 and the n-type contact layer 137 are examples of the "second nitride-based semiconductor layer" in the present invention.

According to the sixth embodiment, a light transmission layer 138 of undoped GaN having a thickness of about 2 µm is formed on the n-type contact layer 137. This light transmission layer 138 has an opening 138a. The p-type contact layer 133, the cap layer 134, the active layer 135, the n-type cladding layer 136, the n-type contact layer 137 and the light transmission layer 138 constitute the nitride-based semiconductor element layer 139. According to the sixth embodiment, the forward end of the nitride-based semiconductor element layer 139 closer to the light transmission layer 138 has side surfaces 139a inclined by a prescribed angle with respect to the normal of the light emission surface 141. More specifically, the forward end of the nitride-based semiconductor element layer 139 closer to the light transmission layer 138 has the side surfaces 139a inclined by about 45°, to be tapered from the side of the conductive substrate 131 toward the side of the light emission surface 141. Further, the side surfaces of the light transmission layer 138 are partially inclined by about 45°. In addition, the inclined surfaces 139a of the nitride-based semiconductor element layer 139 and the light emission surface 141 form an obtuse angle (about 135°). According to the sixth embodiment, the surface of the light transmission layer 138 forming the light emission surface 141 is textured.

An n-side electrode 140 is formed in the opening 138a of the light transmission layer 138, to be in contact with the surface of the n-type contact layer 137. The n-side electrode 140 is constituted of an ohmic electrode layer, a barrier metal layer and a pad metal layer successively from the side closer to the n-type contact layer 137. The ohmic electrode layer constituting the n-side electrode 140 is formed by an Al layer having a thickness of about 100 nm. The barrier metal layer constituting the n-side electrode 140 is formed by a Pt or Ti layer, having a thickness of about 100 nm, for suppressing reaction between the ohmic electrode layer and the pad metal layer. The pad metal layer constituting the n-side electrode 140 is formed by a layer of a fusible metal such as Au or Au—Sn having a thickness of about 500 nm. The n-side electrode 140 is an example of the "second electrode layer" in the present invention.

According to the sixth embodiment, as hereinabove described, the conductive substrate 131 is set on the side opposite to the light emission surface 141 while the nitride-based semiconductor element layer 139 is bonded to the conductive substrate 131 so that light formed in the nitride-based semiconductor element layer 139 (active layer 135) can be emitted from the light emission surface 141 opposite to the conductive substrate 131, whereby the light formed in the active layer 135 can be emitted only through the semiconductor element layer 139. Thus, the light is not reflected on the interface between a growth substrate and the nitride-based semiconductor element layer 139 dissimilarly to a case of emitting light from the side of a growth substrate employed for forming the conventional nitride-based semiconductor element layer, whereby light extraction efficiency can be inhibited from reduction. Further, the nitride-based semiconductor element layer 139 is formed to have the side surfaces 139a inclined by about 45° to be tapered from the side of the conductive substrate 131 toward the side of the light emission surface 141 so that light totally reflected on the light emission surface 141 is incident upon the side surfaces 149a inclined with respect to the light emission surface 141, whereby the paths of light can be changed to reduce the angle of the light incidence upon the light emission surface 141 is smaller than the critical angle. Consequently, the light totally reflected on the light emission surface 141 can also be emitted, whereby the light extraction efficiency can be improved. Thus, the light extraction efficiency can be improved through the inclined side surfaces 139a of the nitride-based semiconductor element layer 139 according to the sixth embodiment, while inhibiting the light extraction efficiency from reduction resulting from reflection on the interface between the growth substrate and the nitride-based semiconductor element layer 139.

According to the sixth embodiment, further, the light transmission layer 138 of undoped GaN, formed with no impurity levels resulting from impurity doping, provided on the n-type contact layer 137 of n-type GaN can be more inhibited from light absorption resulting from impurity levels as compared with the n-type contact layer 137 and the n-type cladding layer 136. Therefore, the light totally reflected on the light emission surface 141 (surface of the light transmission layer 138) passes through the light transmission layer 138 having smaller light absorption as compared with the n-type contact layer 137 and the n-type cladding layer 136. Thus, the probability of light absorption can be more reduced as compared with a case where the light totally reflected on the light emission surface 141 passes through only the n-type contact layer 137 and the n-type cladding layer 136 easily causing light absorption resulting from impurity levels. Consequently, the light totally reflected on the light emission surface 141 can be inhibited from absorption, whereby the light extraction efficiency can be more improved.

According to the sixth embodiment, in addition, the light emission surface 141 (surface of the light transmission layer 138) is so textured that the same can be inhibited from totally reflecting light, whereby the light extraction efficiency can be further improved.

The remaining effects of the sixth embodiment are similar to those of the aforementioned first embodiment.

A manufacturing process for the nitride-based semiconductor light-emitting diode device according to the sixth embodiment is now described with reference to FIGS. 40 to 47.

Figure 41:
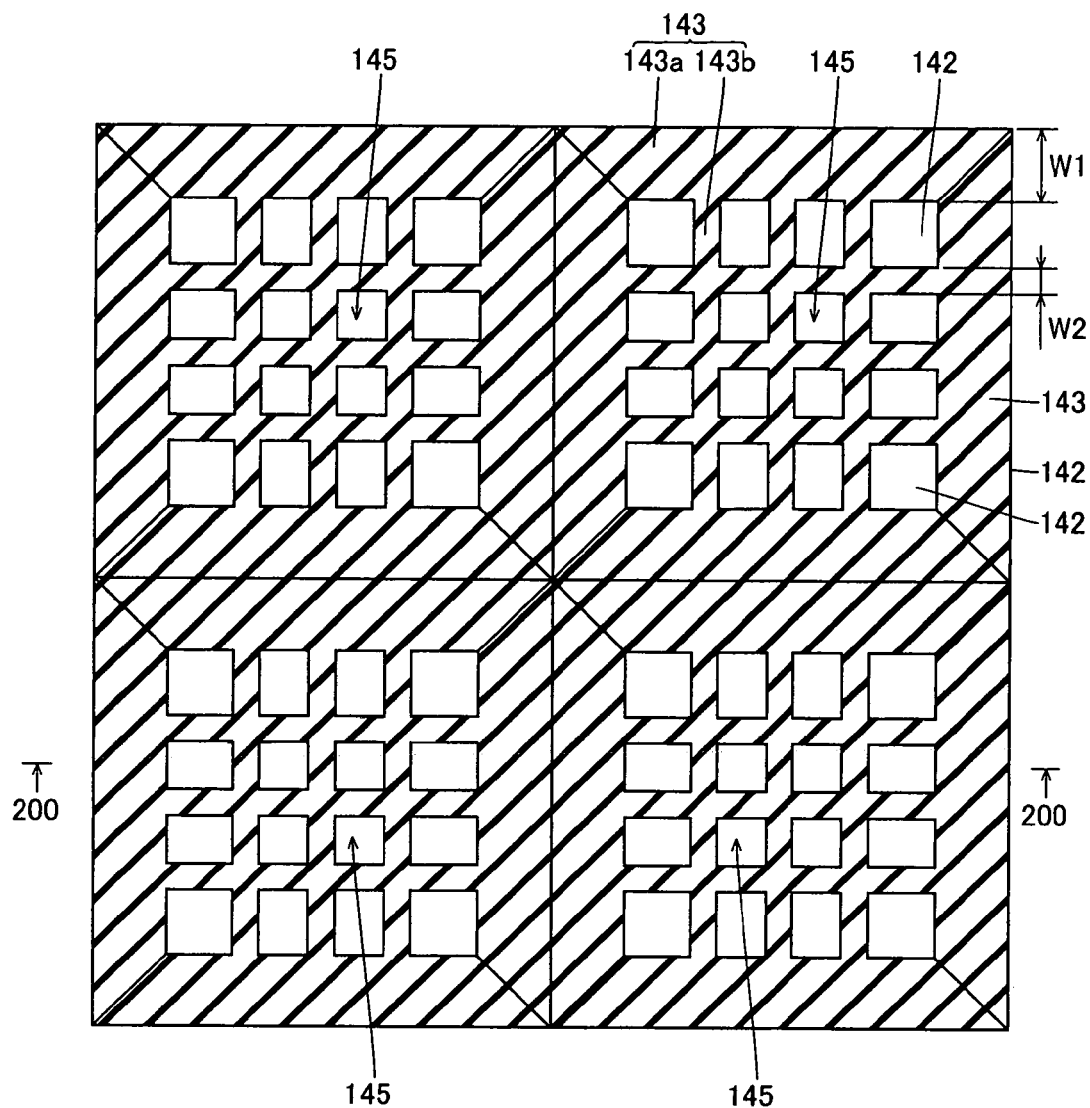
FIG. 41 is a plan view for illustrating a manufacturing process for the nitride-based semiconductor light-emitting diode device according to the sixth embodiment shown in FIG. 40.
Figure 42:
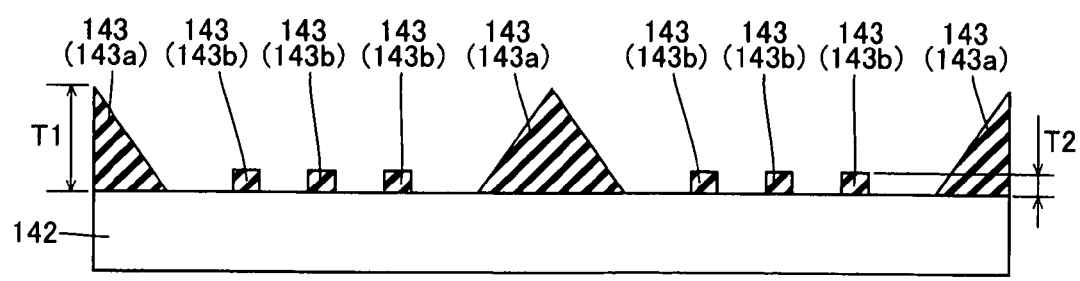
FIG. 42 is a sectional view taken along the line 200-200 in FIG. 41.

As shown in FIG. 41 (plan view) and FIG. 42 (sectional view taken along the line 200—200 in FIG. 41), a mask layer 143 of SiN is formed on each prescribed region of an Si substrate 142 employed as the growth substrate by plasma CVD. More specifically, the mask layer 143 is formed to have a portion 143a enclosing a region 145 for forming each device and a latticed portion 143 enclosed with the portion 143a in plan view, as shown in FIG. 41. The region 145 for forming each device is a quadratic region about 500 μm square. The widths W1 and W2 of the portions 143a and 143b of the mask layer 143 are set to about 1.8 μm and about 0.6 μm respectively. Further, the side surfaces of the portion 143a of the mask layer 143 are inclined by a prescribed angle, as shown in FIG. 42. The height T1 of the portion 143a of the mask layer 143 is set to about 1.8 μm, while the height (thickness) T2 of the portion 143b of the mask layer 143 is set to about 0.4 μm.

Figure 43:
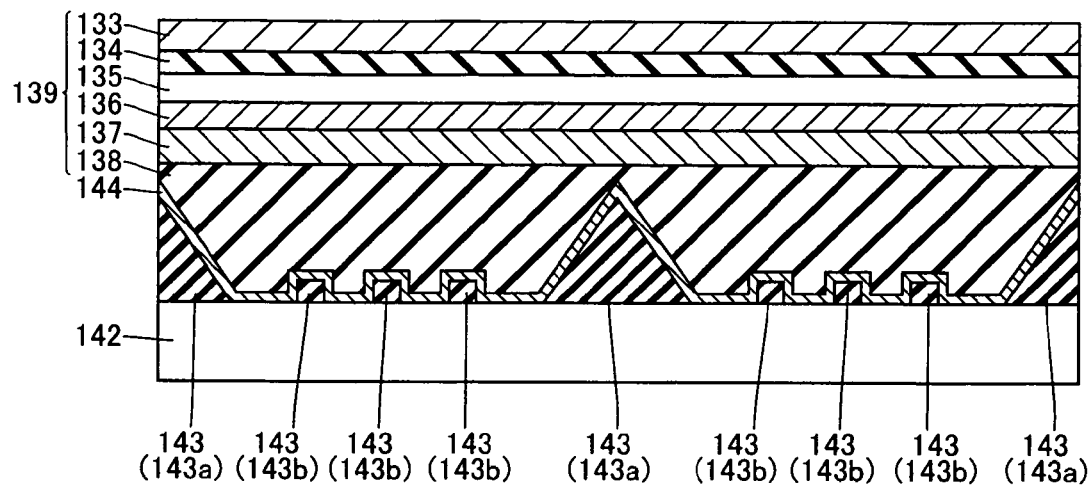
FIGS. 43 to 47 are sectional views for illustrating the manufacturing process for the nitride-based semiconductor light-emitting diode device according to the sixth embodiment shown in FIG. 40.

As shown in FIG. 43, a buffer layer 144 of AlN having a thickness of about 10 nm to about 50 nm is grown on the SiC substrate 142 by MOCVD, to cover each mask layer 143. Thereafter the light transmission layer 138 of undoped GaN having the thickness of about 2 μm is grown on the buffer layer 144. At this time, the light transmission layer 138 is selectively vertically grown on a portion of the buffer layer 144 located on a region other than that formed with the mask layer 143 and thereafter gradually laterally grown so that the surface thereof is flattened. Therefore, dislocations formed on the light transmission layer 138 are laterally bent to hardly form vertically propagated dislocations. Thus, the dislocation density of the light transmission layer 138 can be remarkably reduced.

Then, the n-type contact layer 137 of n-type GaN doped with Ge having the thickness of about 0.5 μm and the n-type cladding layer 136 of n-type $Al_{0.05}Ga_{0.95}N$ doped with Ge having the thickness of about 0.05 μm are successively grown on the light transmission layer 138. Thereafter the four barrier layers (not shown) of undoped GaN each having the thickness of about 10 nm and the three well layers (not shown) of undoped $Ga_{0.85}In_{0.15}N$ each having the thickness of about 3 nm are so alternately grown as to grow the active layer 135 having the MQW structure obtained by alternately stacking the four barrier layers and the three well layers.

Then, the cap layer 134 of undoped $Al_{0.05}Ga_{0.95}N$ having the thickness of about 5 nm and the p-type contact layer 133 of p-type GaN doped with Mg having the thickness of about 0.2 μm are successively grown on the active layer 135. The nitride-based semiconductor element layer 139 constituted of the p-type contact layer 133, the cap layer 134, the active layer 135, the n-type cladding layer 136, the n-type contact layer 137 and the light transmission layer 138 is formed in this manner. Thereafter the p-type contact layer 133 is converted to the p type by heat treatment or electron beam treatment.

Figure 44:
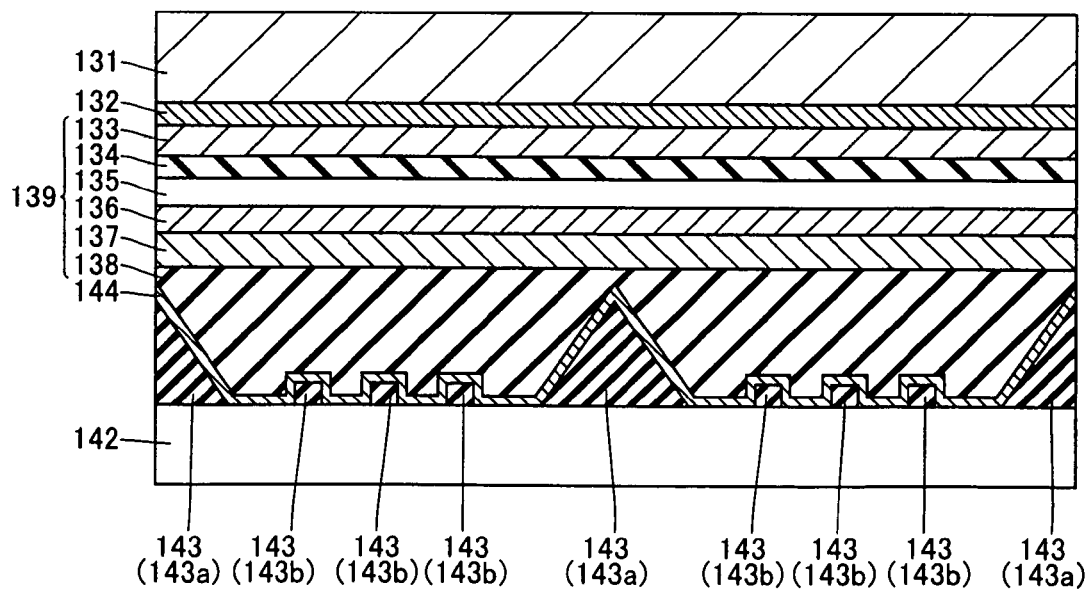
Figure 45:
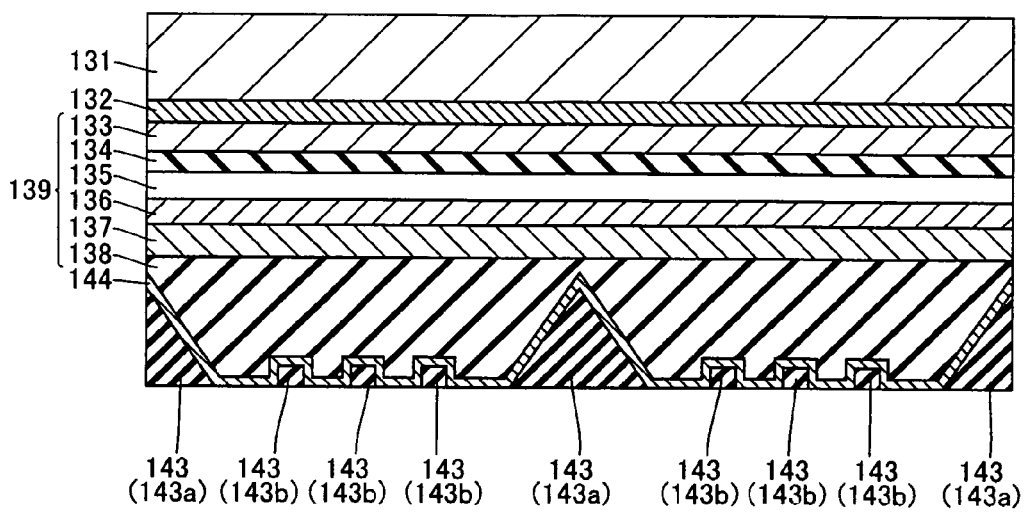

As shown in FIG. 44, the p-side electrode 132 composed of the Al layer and the Ag layer is formed on the p-type contact layer 133 by vacuum evaporation or the like. At this time, the Al layer having the thickness of about 5 nm is provided in the form of an island, and the Ag layer having the thickness of about 200 nm is formed to cover the overall surface thereof. Thereafter the conductive substrate 131 is bonded to the p-side electrode 132 through a process similar to that of the first embodiment shown in FIG. 10. Thereafter the Si substrate 142 is removed by wet etching. Thus, the mask layer 143 and the buffer layer 144 are exposed as shown in FIG. 45.

Figure 46:
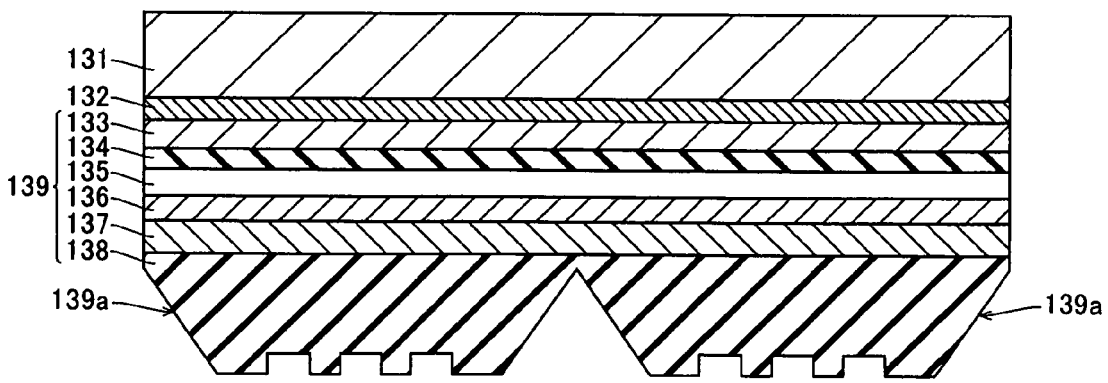

Further, the mask layer 143 and the buffer layer 144 are removed by etching, thereby exposing the light transmission layer 138 as shown in FIG. 46. Thus, the light transmission layer 138 is brought into a shape reflecting the shapes of the portions 143a and 143b (see FIGS. 41 and 42) of the mask layer 143. In other words, the forward end of the nitride-based semiconductor element layer 139 closer to the light transmission layer 138 is tapered from the side of the conductive substrate 131 toward the side of the light transmission layer 138, while the inclined side surfaces 139a of the nitride-based semiconductor element layer 139 and the surface of the light transmission layer 138 form an obtuse angle. In addition, the surface of the light transmission layer 138 constituting the nitride-based semiconductor element layer 139 is textured in reflection of the shape of the latticed portion 143b of the mask layer 143.

Figure 47:
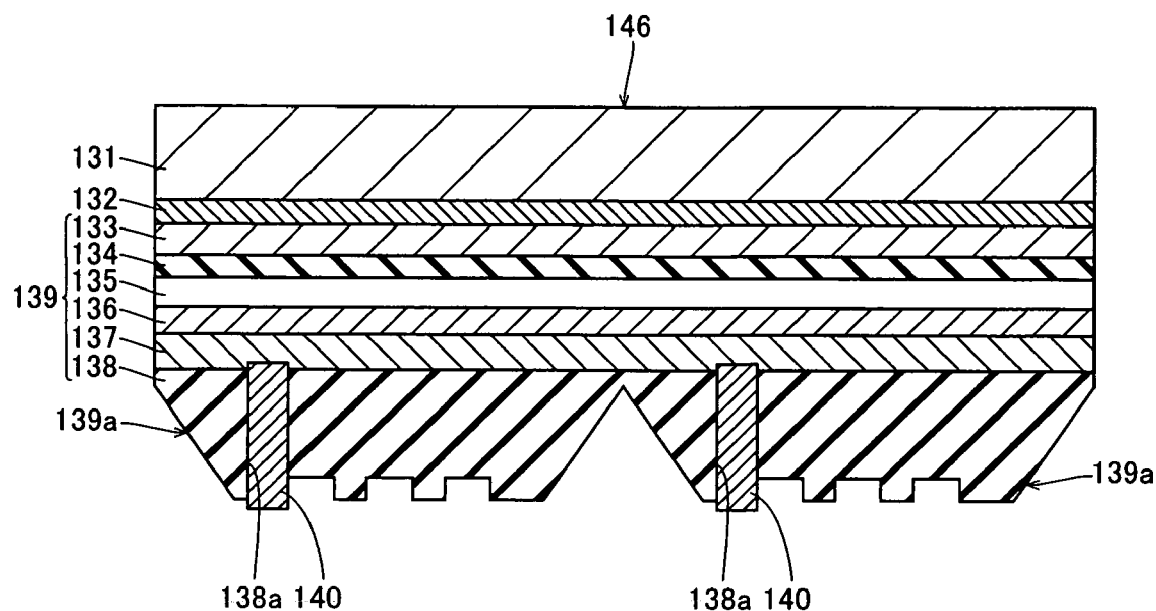
Figure 48:
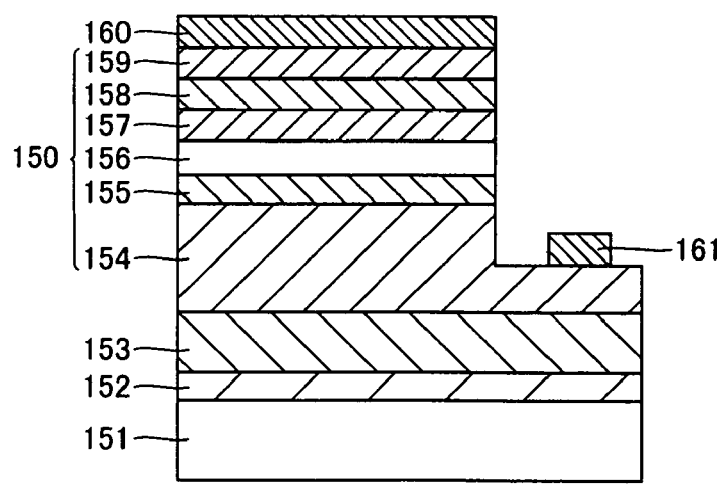
FIG. 48 is a sectional view showing the structure of a conventional nitride-based semiconductor light-emitting diode device.

As shown in FIG. 47, the opening 138a is formed on a prescribed region of the light transmission layer 138 by etching, to expose the surface of the n-type contact layer 137. Thereafter the n-side electrode 140 is formed in the opening 138a of the light transmission layer 138 by vacuum evaporation or the like, to be in contact with the surface of the n-type contact layer 137. At this time, the ohmic electrode layer, the barrier metal layer and the pad metal layer are formed successively from the side closer to the n-type contact layer 137. The ohmic electrode layer constituting the n-side electrode 140 is formed by the Al layer having the thickness of about 100 nm. The barrier metal layer constituting the n-side electrode 140 is formed by the Pt or Ti layer having the thickness of about 100 nm. The pad metal layer constituting the n-side electrode 140 is formed by the layer of Au or Au—Sn having the thickness of about 500 nm. Finally, the device is separated from an adjacent device along an element separation region 146 through a process similar to that of the first embodiment shown in FIG. 7. Thus, the nitride-based semiconductor light-emitting diode device according to the sixth embodiment is formed as shown in FIG. 40.

In the manufacturing process according to the sixth embodiment, as hereinabove described, the mask layer 143 is formed on the prescribed region of the Si substrate 142 and the light transmission layer 138 is thereafter grown on the Si substrate 142 so that the light transmission layer 138 is laterally grown to reduce the number of dislocations formed thereon, whereby the number of dislocations propagated to the active layer 135 grown on the light transmission layer 138 can also be reduced. Thus, the dislocation density of the active layer 135 can be so reduced that emission efficiency in the active layer 135 as well as the life of the device can be improved. Further, the light transmission layer 138 so consists of undoped GaN that lateral growth can be more prompted as compared with a case of growing a light transmission layer doped with an impurity such as Si. Thus, the surface of the light transmission layer 138 can be flattened with a small thickness.

Although the present invention has been described and illustrated in detail, it is clearly understood that the same is by way of illustration and example only and is not to be taken by way of limitation, the spirit and scope of the present invention being limited only by the terms of the appended claims.

For example, while the nitride-based semiconductor light-emitting diode device is so formed as to emit light from the n side in each of the aforementioned first to sixth embodiments, the present invention is not restricted to this but an n-type nitride-based semiconductor layer, an active layer and a p-type nitride-based semiconductor layer may be successively formed on a conductive substrate for alternatively emitting light from a p side.

While the sapphire, SiC, Si or GaN substrate is employed as the growth substrate in each of the aforementioned first to sixth embodiments, the present invention is not restricted to this but a GaAs, MgO, ZnO, LAO, $Ga_2O_3$ or spinel substrate may alternatively be employed as the growth substrate.

While the p-side electrode is formed by the lower Au layer, closer to the conductive substrate, having the thickness of about 100 nm and the upper Pd layer having the thickness of about 300 nm or by the lower Ag layer having the thickness of about 200 nm and the upper Al layer having the thickness of about 5 nm in each of the aforementioned first to sixth embodiments, the present invention is not restricted to this but the p-side electrode may alternatively be formed by a plurality of metal layers other than the Au and Pd layers or the Ag and Al layers. In place of the Au and Pd layers or the Ag and Al layers, the p-side electrode may be formed by a plurality of metal layers such as a lower Al layer (thickness: about 300 nm) and an upper Pd layer (thickness: about 10 nm), a lower Ag layer (thickness: about 300 nm), an intermediate Ti layer (thickness: about 10 nm) and an upper Pt layer (thickness: about 10 nm), a lower Ag layer (thickness: about 300 nm) and an upper Pd layer (thickness: about 30 nm), a lower Al layer (thickness: about 200 nm), an intermediate Ni layer (thickness: about 50 nm), an intermediate Ag layer (thickness: about 300 nm) and an upper Ti layer (thickness: about 1 nm), a lower Al layer (thickness: about 200 nm), an intermediate Ni layer (thickness: about 50 nm), an intermediate Ag layer (thickness: about 300 nm) and an upper Ni layer (thickness: about 0.5 nm), a lower Al layer (thickness: about 200 nm), an intermediate Ni layer (thickness: about 50 nm), an intermediate Ag layer (thickness: about 300 nm) and an upper Al layer (thickness: about 0.5 nm) or a lower Ti layer (thickness: 20 nm), an intermediate Ag layer (thickness: about 300 nm) and an upper Al layer (thickness: about 0.3 nm) from the side closer to the conductive substrate, for example. The p-side electrode may be either entirely or partially formed on the surface of the nitride-based semiconductor element layer closer to the conductive substrate. When the p-side electrode is only partially formed on the surface of the nitride-based semiconductor element layer closer to the conductive substrate, a layer for reflecting light is preferably formed on the remaining region other than that formed with the p-side electrode. Further, a pad electrode is preferably formed between the p-side electrode and the conductive substrate, in order to reinforce the bonding power therebetween. The pad electrode may be constituted of a lower Au layer, an intermediate Pd layer and a Ti layer, a lower Au layer, an intermediate Pt layer and an upper Ti layer or a lower Au layer, an intermediate Mo layer and an upper Ti layer from the side closer to the conductive substrate, for example. When solder is employed for bonding the p-side electrode to the conductive substrate, a barrier metal layer of Pt or Pd is preferably formed as a protective film for the p-side electrode.

While the p-side electrode is formed by the lower Au layer, closer to the conductive substrate, having the thickness of about 100 nm and the upper Pd layer having the thickness of about 300 nm or the lower Ag layer having the thickness of about 200 nm and the upper Al layer having the thickness of about 5 nm in each of the aforementioned first to sixth embodiments, the present invention is not restricted to this but the thicknesses of or the materials for the metal layers constituting the p-side electrode may alternatively be varied with the emission wavelength for reducing light absorption on the p-side electrode.

While the p-side electrode is formed by the lower Au layer closer to the conductive substrate and the upper Pd layer in each of the aforementioned first to fifth embodiments, the present invention is not restricted to this but an Al layer having higher light reflectance than the Au and Pd layers may alternatively be employed for further improving the light output characteristic by increasing the quantity of emitted reflected light. In this case, ohmic contact can be easily attained by providing an electrode layer of a transparent material between the Al layer and the nitride-based semiconductor element layer, dissimilarly to a case of bonding the Al layer and the nitride-based semiconductor element layer, which are hard to attain ohmic contact, to each other.

While the n-side electrode having the thickness incapable of transmitting light is formed by the Au layer, the Pd layer and the Al layer or the Al layer, the Pt layer (Ti layer) and the Au layer (Au—Sn layer) in each of the aforementioned first to sixth embodiments, the present invention is not restricted to this but an electrode formed by metal, transparent or semitransparent materials having a thickness capable of transmitting light can alternatively be employed. A pad electrode is preferably formed on the n-side electrode, in order to connect a gold wire.

While the nitride-based semiconductor element layer includes the layers of GaN, AlGaN and InGaN in each of the aforementioned first to sixth embodiments, the present invention is not restricted to this but the nitride semiconductor element layer may alternatively include layers of nitride-based semiconductors other than GaN, AlGaN and InGaN. For example, group III-V nitride-based semiconductors such as AlN (aluminum nitride), InN (indium nitride), BN (boron nitride) and TlN (thallium nitride), mixed crystals of the group III-V nitride semiconductors and the like are conceivably employed as the nitride-based semiconductors other than GaN, AlGaN and InGaN. Further, mixed crystals prepared by introducing at least one of As, P and Sb into the aforementioned group III-V nitride semiconductors and mixed crystals thereof are also conceivable.

While the light transmission layer is laterally grown after forming the mask layer on the substrate in the aforementioned sixth embodiment, the present invention is not restricted to this but the light transmission layer may alternatively be laterally grown by ELO (epitaxial lateral overgrowth), PENDEO (pendeoepitaxy) or LEPS (lateral epitaxy on the patterned substrate).

What is claimed is:

1. A nitride-based semiconductor light-emitting device comprising:
    a first conductive type first nitride-based semiconductor layer formed on the surface of a conductive substrate;
    an active layer of a nitride-based semiconductor formed on said first nitride-based semiconductor layer;
    a second conductive type second nitride-based semiconductor layer formed on said active layer and having a first carrier concentration; and
    a light transmission layers through which light formed in the active layer is emitted from the device, formed on said second nitride-based semiconductor layer, the light transmission layer consisting of a nitride-based semiconductor layer having a second carrier concentration lower than the first carrier concentration of said second nitride-based semiconductor layer.

2. The nitride-based semiconductor light-emitting device according to claim 1, wherein
    said first conductive type first nitride-based semiconductor layer is a p-type nitride-based semiconductor layer, and
    said second conductive type second nitride-based semiconductor layer is an n-type nitride-based semiconductor layer.

3. The nitride-based semiconductor light-emitting device according to claim 1, wherein
    said light transmission layer includes an undoped nitride-based semiconductor layer.

4. The nitride-based semiconductor light-emitting device according to claim 1, wherein
    said light transmission layer includes a second conductive type nitride-based semiconductor layer doped with a second conductive type impurity.

5. The nitride-based semiconductor light-emitting device according to claim 1, wherein
    said light transmission layer includes a nitride-based semiconductor layer containing at least Al.

6. The nitride-based semiconductor light-emitting device according to claim 5, wherein
    said light transmission layer includes said nitride based semiconductor layer of AlGaN.

7. The nitride-based semiconductor light-emitting device according to claim 1, wherein
    said light transmission layer has a textured surface.

8. The nitride-based semiconductor light-emitting device according to claim 1, further comprising a layer, formed on said light transmission layer, having a textured surface and consisting of a material other than a nitride-based semiconductor.

9. The nitride-based semiconductor light-emitting device according to claim 8, wherein
    said layer consisting of said material other than a nitride-based semiconductor includes an insulating film.

10. The nitride-based semiconductor light-emitting device according to claim 1, wherein
    said light transmission layer consists of a material substantially identical to the material for said second nitride-based semiconductor layer.

11. The nitride-based semiconductor light-emitting device according to claim 10, wherein
    said light transmission layer and said second nitride-based semiconductor layer are formed by GaN layers.

12. The nitride-based semiconductor light-emitting device according to claim 10, wherein
    said light transmission layer and said second nitride-based semiconductor layer are formed by AlGaN layers.

13. The nitride-based semiconductor light-emitting device according to claim 1, wherein
    said first nitride-based semiconductor layer is formed on the surface of said conductive substrate through a first electrode layer, and
    said first electrode layer also functions as a reflecting film.

14. The nitride-based semiconductor light-emitting device according to claim 13, wherein
    the surface of said first electrode layer closer to said first nitride-based semiconductor layer is textured.

15. The nitride-based semiconductor light-emitting device according to claim 1, wherein
    said light transmission layer is formed on a partial region of said second nitride-based semiconductor layer,
    the nitride-based semiconductor light-emitting device further comprising a second electrode layer formed to be in contact with a region of the surface of said second nitride-based semiconductor layer not formed with said light transmission layer.

16. The nitride-based semiconductor light-emitting device according to claim 15, wherein
said light transmission layer has an opening, and
said second electrode layer is formed in said opening to be in contact with the surface of said second nitride-based semiconductor layer.

17. The nitride-based semiconductor light-emitting device according to claim 15, further comprising a layer, formed on said light transmission layer, consisting of a material other than a nitride-based semiconductor, wherein
said layer consisting of said material other than a nitride-based semiconductor and said light transmission layer have opening, and
said second electrode layer is formed in said openings to be in contact with the surface of said second nitride-based semiconductor layer.

18. The nitride-based semiconductor light-emitting device according to claim 1, further comprising a protective film covering the side surfaces of said first nitride-based semiconductor layer, said active layer, said second nitride-based semiconductor layer and said light transmission layer.

19. The nitride-based semiconductor light-emitting device according to claim 1, wherein
said light transmission layer has a side surface inclined by a prescribed angle with respect to the normal of a light emission surface.

20. The nitride-based semiconductor light-emitting device according to claim 1, further comprising an electrode on a portion of the second nitride-based semiconductor layer leaving an exposed portion of the second nitride-based semiconductor layer, wherein the light transmission layer is formed on the exposed portion of the second nitride-based semiconductor layer.

* * * * *